(12) United States Patent
Mishra et al.

(10) Patent No.: US 12,230,678 B2
(45) Date of Patent: Feb. 18, 2025

(54) III-N BASED MATERIAL STRUCTURES, METHODS, DEVICES AND CIRCUIT MODULES BASED ON STRAIN MANAGEMENT

(71) Applicant: The Regents of the University of California, Oakland, CA (US)

(72) Inventors: Umesh K. Mishra, Montecito, CA (US); Stacia Keller, Santa Barbara, CA (US); Elaheh Ahmadi, Hyattsville, MD (US); Chirag Gupta, Goleta, CA (US); Yusuke Tsukada, Ibaraki (JP)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 790 days.

(21) Appl. No.: 17/291,842

(22) PCT Filed: Nov. 7, 2019

(86) PCT No.: PCT/US2019/060353
§ 371 (c)(1),
(2) Date: May 6, 2021

(87) PCT Pub. No.: WO2020/149922
PCT Pub. Date: Jul. 23, 2020

(65) Prior Publication Data
US 2021/0399096 A1    Dec. 23, 2021

Related U.S. Application Data

(60) Provisional application No. 62/756,999, filed on Nov. 7, 2018.

(51) Int. Cl.
| | | |
|---|---|---|
| *H01L 29/20* | (2006.01) | |
| *H01L 27/092* | (2006.01) | |
| *H01L 29/205* | (2006.01) | |
| *H01L 29/737* | (2006.01) | |
| *H01L 29/778* | (2006.01) | |
| *H01L 29/78* | (2006.01) | |
| *H01L 33/32* | (2010.01) | |

(52) U.S. Cl.
CPC ...... *H01L 29/2003* (2013.01); *H01L 27/0924* (2013.01); *H01L 29/205* (2013.01);
(Continued)

(58) Field of Classification Search
CPC ............ H01L 29/2003; H01L 27/0924; H01L 29/205; H01L 29/7378; H01L 29/7786;
(Continued)

(56) References Cited

U.S. PATENT DOCUMENTS

2008/0173898 A1* 7/2008 Ohmaki .............. H01L 29/0657
257/E27.012
2013/0264540 A1   10/2013 Chakraborty et al.
(Continued)

FOREIGN PATENT DOCUMENTS

WO     2017099752     6/2017

OTHER PUBLICATIONS

Suzuki, M., et al., "Strain effect on electronic and optical properties of GaN/AlGaN quantum-well lasers", J. Appl. Phys., Dec. 1996, pp. 6868-6874, vol. 80, No. 12.
(Continued)

*Primary Examiner* — Mohammad M Hoque
(74) *Attorney, Agent, or Firm* — GATES & COOPER LLP

(57) ABSTRACT

The disclosure describes the use of strain to enhance the properties of p- and n-materials so as to improve the performance of III-N electronic and optoelectronic devices. In one example, transistor devices include a channel aligned along uniaxially strained or relaxed directions of the III-nitride material in the channel. Strain is introduced using buffer layers or source and drain regions of different composition

20 Claims, 40 Drawing Sheets

(52) U.S. Cl.
CPC ...... *H01L 29/7378* (2013.01); *H01L 29/7786* (2013.01); *H01L 29/7848* (2013.01); *H01L 33/32* (2013.01)

(58) Field of Classification Search
CPC ............... H01L 29/7848; H01L 33/32; H01L 29/66318; H01L 33/14; H01L 21/8252; H01L 27/0605; H01L 27/082; H01L 21/823807; H01L 29/045; H01L 29/0657; H01L 29/0692; H01L 29/1054; H01L 29/155; H01L 29/66462; H01L 29/0847; H01L 29/737; H01L 29/7371; H01L 29/7781; H01L 29/7784; H01L 29/7789; H01L 29/785; H01L 33/12; H01L 33/16; H01L 33/20
USPC .......................................................... 257/76
See application file for complete search history.

(56) References Cited

U.S. PATENT DOCUMENTS

| | | | |
|---|---|---|---|
| 2014/0131730 A1* | 5/2014 | Keller | H01L 31/0735 438/47 |
| 2017/0098703 A1 | 4/2017 | Ogawa et al. | |
| 2018/0331222 A1* | 11/2018 | Dasgupta | H01L 29/267 |

OTHER PUBLICATIONS

Keller, S., et al., "Optical properties of GaN nanopillar and nanostripe arrays with embedded InGaN/GaN multi quantum wells", phys. stat. sol. (b), 2007, pp. 1797-1801, vol. 244, No. 6.

Keller, S., et al., "Optical and structural properties of GaN nanopillar and nanostripe arrays with embedded InGaN/GaN multi-quantum wells", Journal of Applied Physics, 2006, pp. 054314-1-054314-7, vol. 100.

Keller, S., et al., "InGaN lattice constant engineering via growth on (In,Ga)N/GaN nanostripe arrays", Semicond. Sci. Technol., 2015, pp. 1-9, vol. 30.

Liu, X., et al., "In-situ metalorganic chemical vapor deposition and capacitance-voltage characterizations of Al 2O3 on Ga-face GaN metal-oxide-semiconductor capacitors", Applied Physics Letters, 2013, pp. 053509-1-053509-5, vol. 103.

Chan, S.H., et al., "Impact of oxygen precursor flow on the forward bias behavior of MOCVD-Al2O3 dielectrics grown on GaN", Journal of Applied Physics, 2017, pp. 174101-1174101-7, vol. 122.

Fehlberg, T.B., et al., "Characterisation of Multiple Carrier Transport in Indium Nitride Grown by Molecular Beam Epitaxy", Japanese Journal of Applied Physics, 2006, pp. L1090-L1092, vol. 45, No. 41.

Yarar, Z., et al., "Transport and Mobility Properties of Bulk Indium Nitride (InN) and a Two-Dimensional Electron Gas in an InGaN/GaN Quantum Well", Journal of Electronic Materials, 2007, pp. 1303-1312.

Piprek, J., et al., "Analysis of Electroluminescent Cooling in GaN-LEDs", IEEE International conference on Numerical Simulation of Optoelectronic Devices, 2016, pp. 105-106.

Piprek, J., et al., "Comparative analysis of efficiency limitations in GaN-based blue laser diodes", IEEE International conference on Numerical Simulation of Optoelectronic Devices, 2016, pp. 205-206.

PCT International Search Report & Written Opinion dated Sep. 11, 2020 for PCT Application No. PCT/US19/60353.

Romanyuk, O., et al., "Polarity of GaN with polar {0001} and semipolar {1011 }, {2021}, {1122} orientations by x-ray photoelectron diffraction", Mater. Res., Oct. 14, 2015, pp. 2881-2892, vol. 30, No. 19.

* cited by examiner relaxed: a(A) < a(B)

(Color online) The valence band structure under strained condition of a-plane bulk $In_{0.2}Ga_{0.8}N$ material along (a) the $k_y$ direction and the $k_z$ direction and (b) along the $k_y$ direction and the $k_z$ direction.

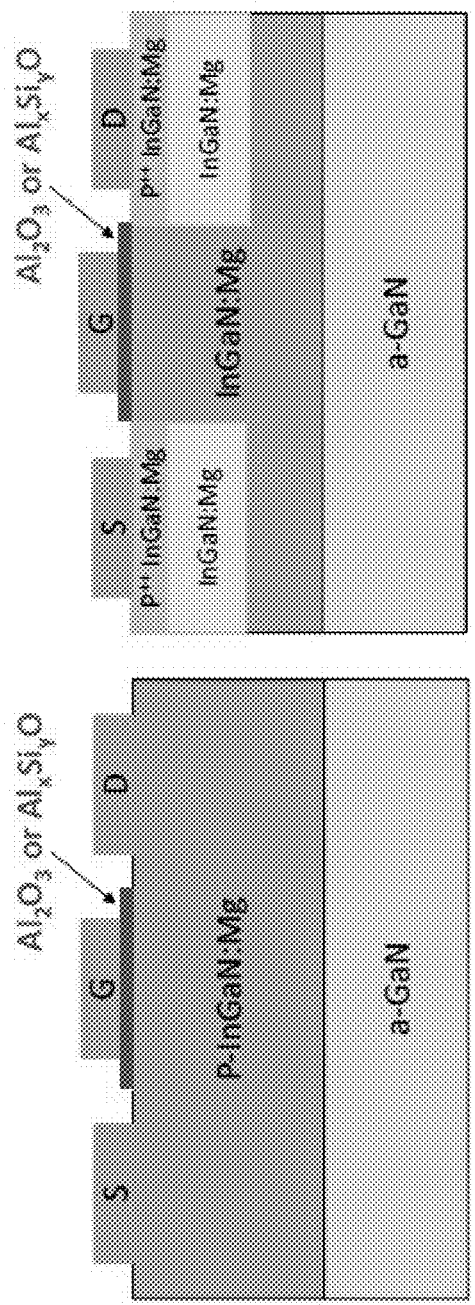
*Fig. 25A*
*Fig. 25B*
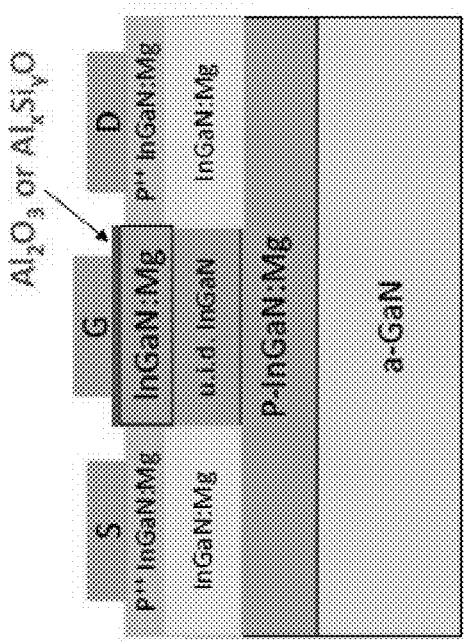
*Fig. 26* relaxed: a(A) > a(B), e.g. A=(In,Ga)N, B=GaN

|     | $m_e^\parallel$ | $m_e^\perp$ | $m_{hh}^\parallel$ | $m_{lh}^\parallel$ | $m_{ch}^\parallel$ | $m_{hh}^\perp$ | $m_{lh}^\perp$ | $m_{ch}^\perp$ | $\Delta_{cr}$ | $\Delta_{so}$ |
|-----|------|------|------|------|------|-------|------|------|------|-----|
| GaN | 0.20 | 0.18 | 1.76 | 1.76 | 0.16 | 1.61  | 0.14 | 1.04 | 5.3  | 1.2 |
| AlN | 0.33 | 0.25 | 3.53 | 3.53 | 0.25 | 10.42 | 0.24 | 3.81 | −4.3 | 1.5 |

Fig. 37

III-N BASED MATERIAL STRUCTURES, METHODS, DEVICES AND CIRCUIT MODULES BASED ON STRAIN MANAGEMENT

CROSS REFERENCE TO RELATED APPLICATIONS

This application claims the benefit under 35 U.S.C. Section 119(e) of the following commonly-assigned application:

U.S. Provisional Application Ser. No. 62/756,999, filed on Nov. 7, 2018, by Umesh Mishra, Stacia Keller, Elaheh Ahmadi, Chirag Gupta, and Yusuke Tsukada, entitled "III-N BASED MATERIAL STRUCTURES, METHODS, DEVICES AND CIRCUIT MODULES BASED ON STRAIN MANAGEMENT,";

which application is incorporated by reference herein.

STATEMENT REGARDING FEDERALLY SPONSORED RESEARCH AND DEVELOPMENT

This invention was made with Government support under Grant Nos. N00014-16-1-2933, N00014-17-1-2106 and N00014-16-1-2250 from the Office of Naval Research, awarded by the U.S. Office of Naval Research. The Government has certain rights in this invention.

BACKGROUND OF THE INVENTION

1. Field of the Invention

This invention relates to III-N based material structures, methods, devices and circuit modules based on strain management.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

SUMMARY OF THE INVENTION

Previous group-III-Nitride photonic devices are based on biaxial strained heterostructures. Their performance is often limited by the low hole conductivity in group-III Nitride materials, which is associated in part with the high relative hole mass in the nitrides, resulting in a very low hole mobility. This invention describes how strain can be incorporated into photonic nitride heterostructures, resulting in an upward movement of the light hole band and formation of holes with a relative mass less than electrons, as derived from previous band structure calculations. The availability of the light holes results in significant performance improvements in photonic devices. For example, the invention enables the improvement of the performance of optoelectronic devices, in particular lasers and LEDs, where it leads to a significant reduction in the threshold carrier density.

In another embodiment, this invention utilizes strain to enhance the properties of p-channel and n-channel materials and implements the benefits of these materials. The invention enables the improvement of the performance of p-type and n-type III-N electronic devices.

Example devices include, but are not limited to, the following.

1. A device (e.g., electronic or optoelectronic), comprising:

III-nitride material strained along a first direction and at least partially relaxed along a direction perpendicular to the first direction.

2. The device of example 1, wherein the III-nitride is on or above porous III-nitride, and patterned into ridge or fin structures, wherein the porous III-nitride allows relaxation or partial relaxation of the fin structure perpendicular to the fin or the short axis while the fin material remains strained or relaxes less in the direction along the fin or the long direction resulting in uniaxial strain in the fin structure.

3. The device of example 2, wherein the porous III-nitride includes etched pores.

4. The device of example 2 or example 3, wherein the porous III-nitride comprises gallium nitride.

5. The device of example 1, wherein the device is a field effect transistor (FET), including:

a stripe comprising the III-nitride material, wherein:
the III-nitride material is strained along the first direction comprising a long axis of the stripe and at least partially relaxed along the second direction comprising a direction (short axis) perpendicular to the long axis;
the III-nitride material includes a channel layer;
a source contact comprising first metal on the stripe making ohmic contact to the channel;
a drain contact comprising second metal on the stripe making ohmic contact to the channel;
a gate contact on the stripe between the source contact and the drain contact, the gate contact controlling flow of current along a direction of the long axis or short axis through the channel and between the source contact and the drain contact.

6. The device of example 5, wherein:
the channel comprises gallium and/or indium and/or aluminum (and/or boron)
the III-nitride material comprises the channel layer on a layer including gallium and/or aluminum and/or indium and/or boron,
a thickness of the layer comprising gallium and/or aluminum, and/or indium is more than 50% of a thickness of the stripe,
an composition is selected so as to obtain a desired strain in the channel along the long axis.

7. The device of example 5, wherein:
the III-nitride material further includes a source region and a drain region,
the source region is in physical contact with the channel layer between the source contact and the channel layer,
the drain region is in physical contact with the channel layer between the drain contact and the channel layer, and
the source region and the drain region have a lattice constant different than a lattice constant of channel so as to induce the strain in the channel layer along the long axis.

8. The device of example 7, wherein the source region and the drain region comprise gallium and/or aluminum, and/or indium (e.g., InGaN channel case on GaN).

9. The device of any of the examples 5-8, wherein:
the current between the source contact and the drain contact is along the long axis that is a crystallographic a- or m-direction of the III-nitride,
the short axis direction perpendicular to the long axis is a crystallographic m- or a-direction of the III-nitride, respectively.
the top surface of the stripe has a polar (0001) or (000-1) orientation, and
the channel has a lattice constant larger than the underlying III-nitride material.

10. The device of any of the examples 5-8, wherein:
the current between the source contact and the drain contact is along the short axis that is a crystallographic a- or m-direction of the III-nitride,
the long axis direction perpendicular to the short axis is a crystallographic a- or m-direction of the III-nitride,
the top surface of the stripe has a polar (0001) or (000-1) orientation, and
the channel has a lattice constant smaller than the underlying III-nitride material.

11. The device of any of the examples 5-8, wherein:
the current between the source contact and the drain contact is along the short axis that is a crystallographic m-direction of the III-nitride,
the long axis direction perpendicular to the short axis is a crystallographic c-direction of the III-nitride, and
the top surface of the stripe has a nonpolar a- or m-plane orientation.

12. The device of any of the examples 5-9, wherein the FET comprises a p-type FET conducting the current comprising holes and the strain along the long axis is uniaxial compressive strain.

13. A device comprising a CMOS device of any of the examples 5-12 wherein the FET comprises a p-type FET, the CMOS device further including:
the stripe including a second n-type FET including a second source contact to the III-nitride material, a second drain contact to the III-nitride material, and a second gate contact on the stripe between the second source contact and the second drain contact;
the III-nitride material comprises a second n-type channel layer between the second source contact and the second drain contact; and
insulator between the n-type FET and the p-type FET.

14. The CMOS device of example 13, wherein the second channel layer is strained along the long axis between the second source contact and the second drain contact.

15. The devices of any of the examples 5-9 or 13-14, wherein the strain along the long axis is uniaxial compressive strain and the long axis is along a direction of lowest hole effective mass.

16. A device, comprising:
a bipolar heterojunction transistor (BJT), including:
a stripe comprising first n-type material, wherein the n-type is strained along a long axis of the stripe;
an emitter contact on a top surface of the stripe;
p-type material between the first n-type material and second n-type material, wherein the p-type material is on a bottom surface of the stripe opposite the emitter contact;
a base contact to the p-type material;
a collector contact to the second n-type material; wherein a direction of electron flow in an active mode of the BJT is between the emitter and the collector.

17. The device of example 16, wherein the strain along the long axis is uniaxial tensile strain.

18. The device of any of the examples 16-17, further comprising the base contact on a side of the stripe parallel to the long axis.

19. The device of any of the examples 16-18, further comprising a plurality of the BJTs attached to the stripe and further including an additional base contact on top of the stripe between the BJTs.

20. The device of any of the examples 16-19, wherein the n-type material and the p-type material comprise III-nitride material.

21. A field effect transistor (FET), comprising:
a stripe including III-nitride material, wherein:
the III-nitride material includes an n-type channel layer strained along a long axis of the stripe and at least partially relaxed along a direction perpendicular to the long axis;
the III-nitride material includes an n-type channel layer which is more strained/less relaxed along a long axis of the stripe and less strained/more relaxed along a direction perpendicular to the long axis; and
the n-type channel layer comprises gallium and/or aluminum, and/or indium;
a source contact comprising first metal on the stripe making ohmic contact to the n-type channel;
a drain contact comprising second metal on the stripe making ohmic contact to the n-type channel;
a gate contact on the stripe between the source contact and the drain contact, the gate contact controlling flow of electron current along the direction perpendicular to the long axis through the n-type channel layer and between the source contact and the drain contact.

22. The FET of example 21, wherein the III-nitride material includes a layer comprising aluminum and gallium and indium between the n-type channel and the source contact, the drain contact, and the gate contact.

23. The FET of examples 21 or 22, wherein a top surface of the stripe on which the source contact and drain contact are formed is an N-polar surface, so that the n-type channel layer has an N-polar orientation.

24. The FET of example 23, wherein the current flows through a 2DEG induced from a back-barrier comprising the layer of gallium and/or aluminum, and/or indium, so contact to the 2DEG is formed over an entire contact area and not merely at an edge of the ohmic regions contacting the n-type channel layer.

25. The device or FET of any of the preceding examples, wherein the stripe length is at least 2 times longer than the stripe width.

26. An optoelectronic device, comprising:
a stripe comprising III-nitride material, wherein:
the III-nitride material is strained along a long axis of the stripe and at least partially relaxed along a direction perpendicular to the long axis or the short axis; and
the III-nitride material includes:
an active region;
a III-nitride n-type layer; and
a III-nitride p-type layer, wherein the active region is between the n-type layer and the p-type layer.

27. The device of example 26, wherein the active region includes InGaN, the p-type region includes n-type GaN, and the p-type layer comprises p-type GaN.

28. The device of example 26 or 27, further comprising:
a pixel including the stripe;
material grown on either side of the stripe so as to create compressive strain in the layers in the stripe, resulting in light hole formation in the enclosed layers and additional improved hole transport occurring along the stripe direction.

29. The device of example 28, wherein the material grown on either side of the stripe comprises InGaN.
30. The device of examples 26-29, wherein the device has an N-polar orientation.
31. The device of examples 26-30, wherein the device comprises a light emitting diode, a laser diode, a solar cell, or a photodiode.
32. A device, comprising:
III-nitride material is strained along a long axis of the stripe and at least partially relaxed along a direction perpendicular to the long axis or the short axis;
the III-nitride material includes a channel layer;
a source contact comprising first metal on the stripe making ohmic contact to the channel;
a drain contact comprising second metal on the stripe making ohmic contact to the channel;
a gate contact on the stripe between the source contact and the drain contact, the gate contact controlling flow of current along a direction of the long axis or short axis through the channel and between the source contact and the drain contact.
33. The device of examples 1-2, wherein the device is a transistor, a light emitting diode, a laser diode, a solar cell or a photodiode, and the III-nitride material includes the device's active region.
34. The device of example 33, wherein the active region includes InGaN.
35. The device of examples 33 or 34, wherein the device is biased and contacted so as to take advantage of lower effective hole mass along the first direction.
36. The device of example 35, wherein the device comprises a field effect transistor including a channel, wherein the source and drain are along the first direction so that current flows along the first direction between the source and the drain.
37. The device of example 36, wherein the III-nitride material is relaxed over a distance of at least one micron in the second direction.
38. A device, comprising: III-nitride material which is at least partially biaxially relaxed.
39. The device of example 1 or 38, wherein the III-nitride is on a porous III-nitride, and patterned into features, wherein the porous III-nitride allows relaxation or partial biaxial relaxation of the structure.
40. The device of example 2 or 39, wherein the porous III-nitride includes etched pores.
41. The device of example 2, 3 or 39 or 40, wherein the porous III-nitride comprises gallium nitride.
42. A device comprising III-nitride or gallium nitride, wherein the III-nitride or the gallium nitride is biaxially strained such that the biaxial strain results in the split-off band as the topmost valence band (above the light hole and the heavy hole in the valence band) resulting in increased hole mobility in a vertical direction.
43. A device, comprising a channel region, wherein the channel region may or may not be on a sidewall, wherein the AlGaN or InGaN is re-grown on an a- or m-plane or semi-polar sidewall of a GaN feature, resulting in enhanced hole mobility in the vertical direction.
44. A device of example 42 and 43, wherein the gallium nitride in example 42 comprises the drift region of the device and example 43 comprises the channel region of the device.

BRIEF DESCRIPTION OF THE DRAWINGS

Referring now to the drawings in which like reference numbers represent corresponding parts throughout:

FIG. 3 (d) Left: schematic of device structure for case that in plane lattice constant a (channel=material C)>a(base of fin=material A), where a is lattice constant. Conversely, the fins can also be fabricated along the orthogonal [1-100] direction. Light hole current flow occurs perpendicular to the fin. Right: final device layout.

FIG. 12. Calculated conduction band effective mass for strained and bulk (strain-free) InGaAs as a function of InAs mole fraction X of In.

FIG. 22-30. Implementations using nonpolar/semipolar orientations. Illustrations are for a-plane material, as example. Similar structures can be fabricated using m-plane material, exchanging the [11-20] and [1-100] axis.

FIG. 22 plots valence band structure under strained conditions of a-plane bulk In0.2Ga0.8N.

FIG. 23 is a cross sectional schematic of a transistor device on a-plane according to a first example.

FIG. 24 is a cross sectional schematic of a transistor device on a-plane according to a second example.

FIG. 25A is a cross sectional schematic of a transistor device on a-plane according to a third example.

FIG. 25B is a cross sectional schematic of a transistor device on a-plane according to a fourth example.

FIG. 26 is a cross sectional schematic of a transistor device on a-plane according to a fifth example.

FIG. 27 is a cross sectional schematic of a device on 0001 or 000-1 GaN.

FIG. 28 is a Transmission Electron Microscope (TEM) image of a device and schematic of a device.

FIG. 29 is a schematic of a transistor device.

FIG. 30 illustrates cross-sectional schematics of transistor structures.

FIGS. 31A, 31B, and 31C illustrate devices on semi-insulating GaN, wherein FIG. 31C illustrates a device according to another example on m-plane GaN.

FIG. 37 shows table I.

DETAILED DESCRIPTION OF THE INVENTION

Figure 1:
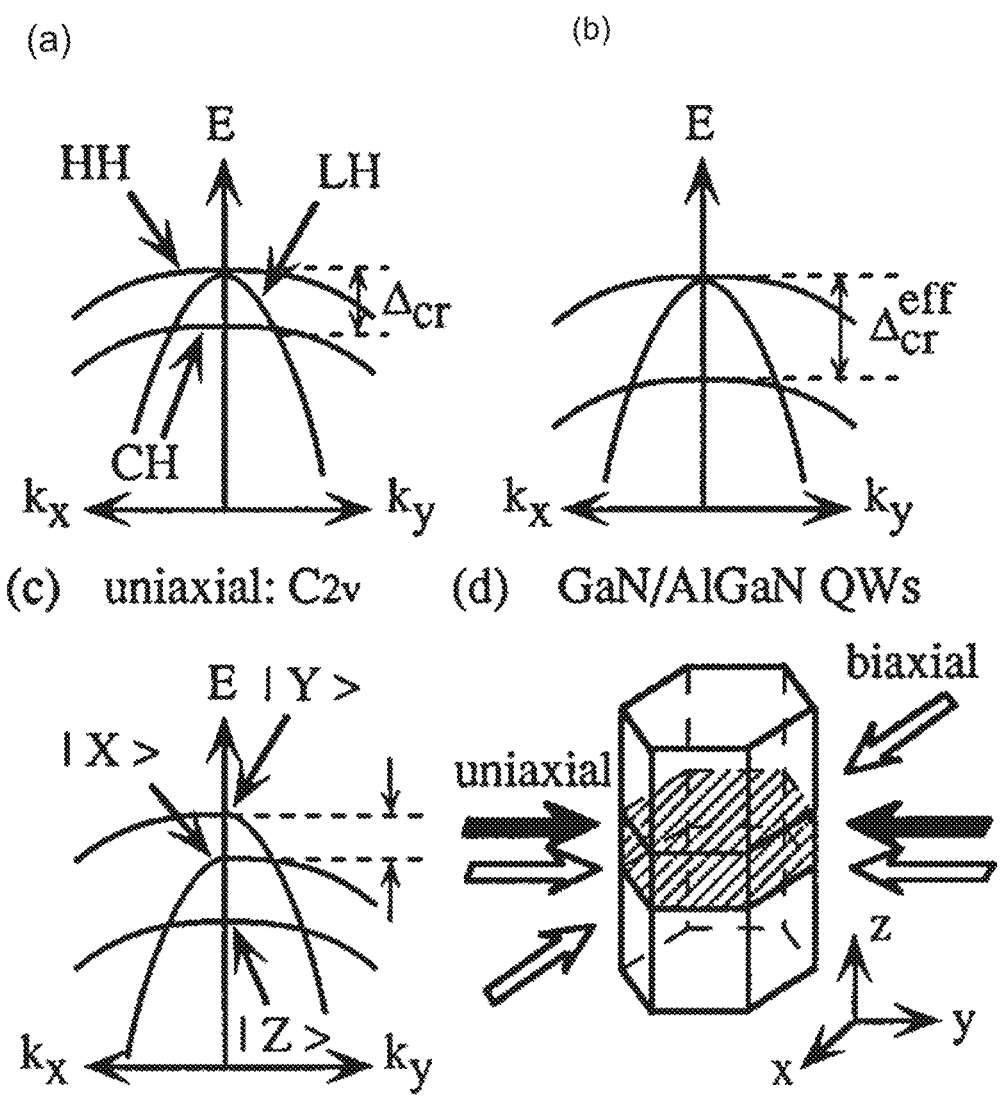
FIG. 1. Schematic valence-band structures of wurtzite GaN (a) without a strain, (b) with a biaxial strain, and (c) with a uniaxial strain. Here, the effect of the weak spin-orbit coupling is neglected. In the case of significant biaxial strain the split off band energies can be substantially affected. (d) Directions of the strains in the c plane. From [1].

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

III-N based structures are widely used for photonic and electronic devices. The state-of-the-art devices are based on either lattice-matched or biaxially strained wurtzite III-N materials. Such materials use in-plane electron and hole material properties that are substantially similar to bulk wurtzite materials. This present disclosure describes structures and methods on a class of materials wherein either the electron or the hole or both materials properties are modified through the appropriate implementation of strain to modify electronic and photonic device performance and enable a new class of circuit embodiments.

Part I: Electronic Devices

P-type channel devices are limited by the transport properties of the p channel. This is dominantly dependent on the effective mass of the holes; the lower the effective mass the higher the hole mobility. In one example, we describe a structure for and method to make high performance p-MOSFETs in GaN. The method and structure is designed using first principles band structure calculations of the anisotropy of the effective mass of holes in the GaN system, as shown in FIG. 1a. The valence band of unstrained GaN exhibits degeneracy of the light hole and heavy hole bands resulting in a large average hole effective mass and therefore a low hole mobility. The situation remains largely unchanged on application of biaxial strain as shown in FIG. 1b. However, as shown in FIGS. 1c and 1d, under the application of uniaxial compressive strain in the y direction, the energy of the light hole band energy rises and there is a marked anisotropy, with a very light hole effective mass available in the $k_y$ direction. The preferred orientation of the pFET channel is in the y-direction. Conversely the uniaxial strain can be applied in the x direction and a very light hole effective mass will be available in the $k_x$ direction and the preferred orientation of the pFET channel will be the x direction. This enables, in one embodiment, the source drain spacing required to hold voltage in a power pFET to exist in the direction of the low hole effective mass. In another embodiment, the source drain spacing could be such that the FET is self-aligned as in conventional digital MOSFETs. The range of effective masses in GaN and AlN are shown in table I. The light hole effective mass, $m_{lh}$, is predicted to be in the range $0.14m_o$, which is even lower than the electron effective mass. Either a strained fin technology or strained stressor and source drain regrowths, when applicable, can be used to implement uniaxial strain as is described in the following sections. The application of uniaxial strain to get high performance p-FETs is an exciting pathway of developing complementary GaN technology.

In addition, vertical light hole effective mass to enhance vertical hole transport (perpendicular to the c plane as an example) can be accessed by using biaxial strain in the target material. As an example, tensile strain in a III-N target material can be generated by growing a material with a smaller lattice constant on a larger lattice constant substrate (for example AlGaN on GaN or GaN on InGaN). The templates can also be generated using commercially available materials employing porous GaN as a compliant layer Table I (FIG. 37). Electron and hole effective masses ($m_0$) and crystal-field and spin-orbit splitting energies (mryd) of bulk wurtzite GaN and AlN. $m_e$, $m_{hh}$, $m_{lh}$, and $m_{ch}$ denote electron, heavy-hole, light-hole, and crystal-field split-off hole effective masses, respectively. The superscripts II and ⊥, stand for the $k_z$ direction and the $k_x$ direction, respectively. $D_{cr}$ and $D_{so}$ represent crystal-field and spin-orbit splitting energies, respectively. From ref. [5]

A. Example Methods to Generate Uniaxial Strain

1. First Example Method

Figure 2:
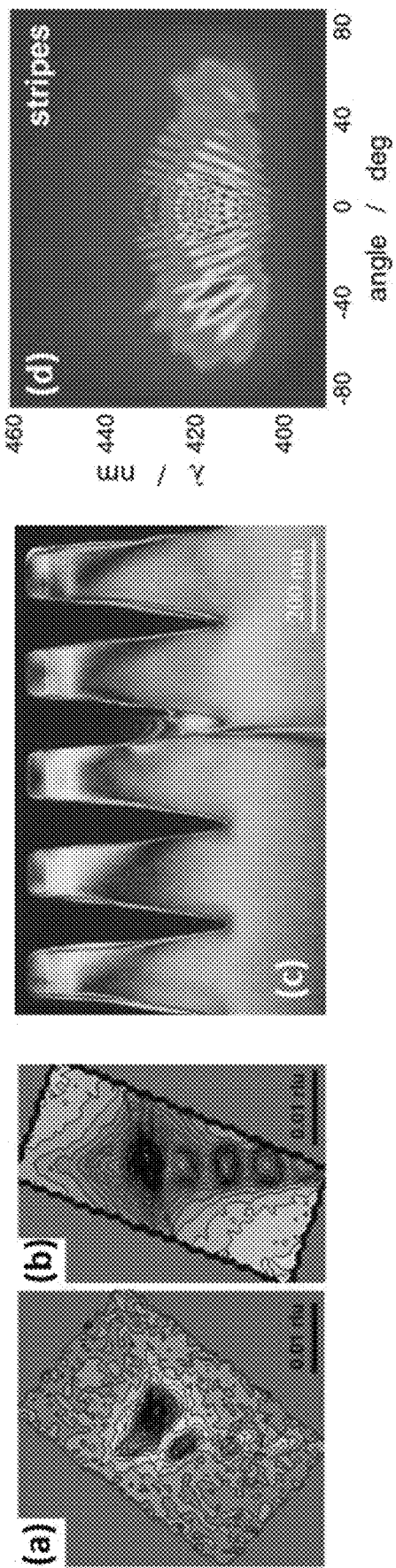
FIG. 2. Reciprocal space maps recorded around the asymmetric (1124) reflection for (a) the nanopillar array fabricated from a 8 period MQW wafer with 9.2 nm-thick GaN barriers and 2.7 nm-thick In0.25Ga0.75 N wells, (a) the nanostripe array fabricated from the same wafer with an angle of 90° between the stripes and the X-ray scattering plane. The RSM (b) was taken from the same nanostripe array around the asymmetric (10-15) reflection with the X-ray scattering plane parallel to the stripes (rlu: reciprocal lattice units), from [2]. (c) TEM image of nanostripe array, From reference [3]. (d) Angular resolved PL spectra recorded from nanostripe arrays fabricated from 5 period MQW fins, from reference [2].

The present disclosure demonstrates uniaxially strained quantum wells by using strain relaxation in fin geometries as seen for an InGaN/GaN Multi Quantum Well (MQW) fin in FIG. 2 [2, 3, 4]. While the MQW fin partially relaxes in the direction perpendicular to the stripe, it is fully strained parallel to the stripe direction. The etched stripe arrays were of high crystalline quality and exhibited intense photoluminescence as illustrated in FIG. 2d.

When the fin structures are composed in part of a porous group-III nitride material, such as porous GaN, for example, or are placed on top of a porous group-III nitride material, relaxation or partial relaxation can be achieved over larger dimensions easing the fabrication process of the fin based devices.

This is the preferred approach to create strained GaN channels for the proposed p-MOSFETs with the ability to hold substantial voltage (greater than 2V) between source/gate and drain. To generate the necessary compressive strain in the GaN channel along the stripe direction, the bulk of the stripes may be composed of $Al_xGa_{1-x}N$, and the amount of strain can be tailored by the specific Al mole fraction x.

Figure 3:
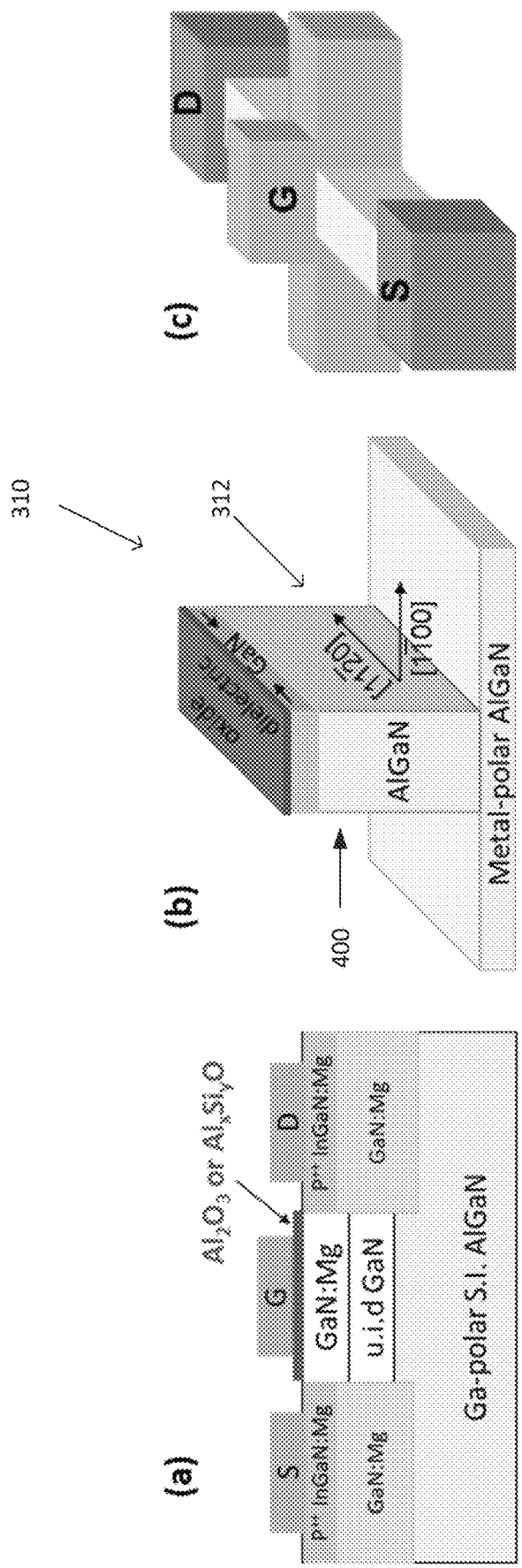
FIG. 3. (a) Schematic of the proposed D-mode device structure, (b) fin design for fins along the [11-20] direction, for example. Conversely, the fins can also be fabricated along the orthogonal [1-100] direction. The GaN {(In,Ga)N} channel on (Al,Ga)N {GaN} is under compression along the fin and light hole current flow occurs along the fin (case: a (channel)>a(base of fin), and (c) final device layout.

The epitaxial layer structures can be grown by MOCVD or MBE or any other technique suitable to deposit III-N materials. The preferred embodiment shown here is based on the metal-polar orientation of the III-N system. The device shown is one in which a substantial voltage (>2V) is held in the source drain direction when the device is in the off-state. On the AlGaN base layers GaN channel, p-GaN:Mg and oxide dielectric layers can be deposited for a metal-polar device design (FIG. 3a). For ease of presentation the structure shown is a depletion mode device and represents the voltage bearing section of the p-FET. The oxide dielectric layers help to reduce gate leakage and thereby enhance the device breakdown performance. A normally-off gate module is achieved by etching the doped region under the gate and applying the MOS gate structure. The dielectrics can be deposited by any suitable technique including, but not limited to, using an MOCVD oxide growth process for the deposition of $Al_2O_3$ and $Al_xSi_yO$ (and $Si_3N_4$) dielectric materials [5,6].

2. Second Method

The second method is to use either strained source-drain contact regions or stressor films or both to induce the strain in the desired region. This is best applied to the self-aligned structures described in the device structures below and also simplified by the use of materials that include porous GaN in the material stack.

3. Porous III-Nitride Example

Figure 3D:
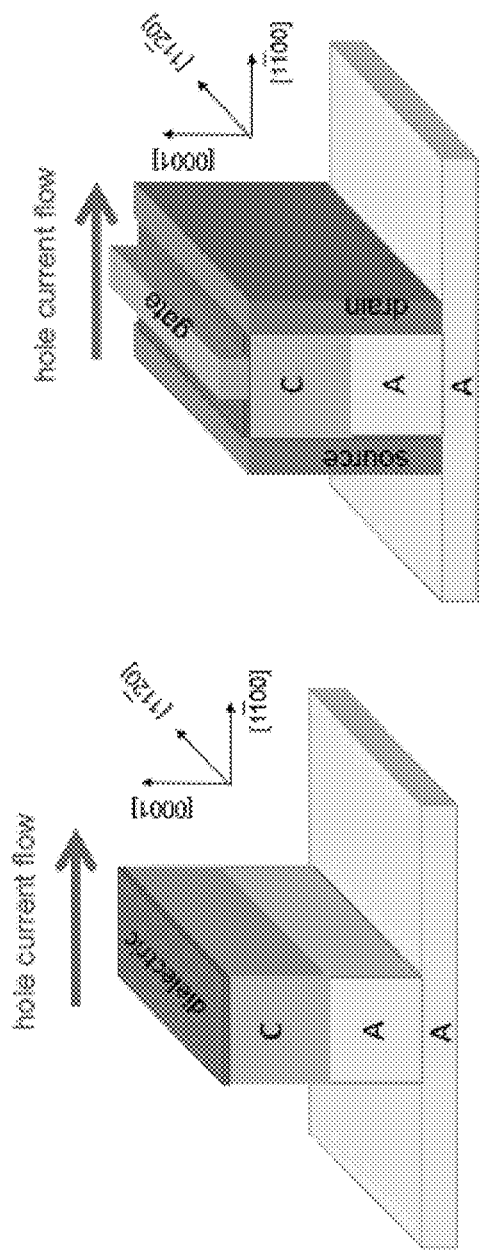
FIG. 3e illustrates a device according to another example.
FIG. 3f. Example structures using porous GaN to aid the relaxation or partial relaxation of material B perpendicular to the fin direction to achieve uniaxial strain. Parallel to the fin along the long axis of the fin material B remains strained to material A or relaxes less compared to the direction perpendicular to the long axis of the fin. Thereby material B can be composed of multiple layers. Using porous GaN, the fin dimensions can be in the micrometer range. a is lattice constant.
Figure 3E:
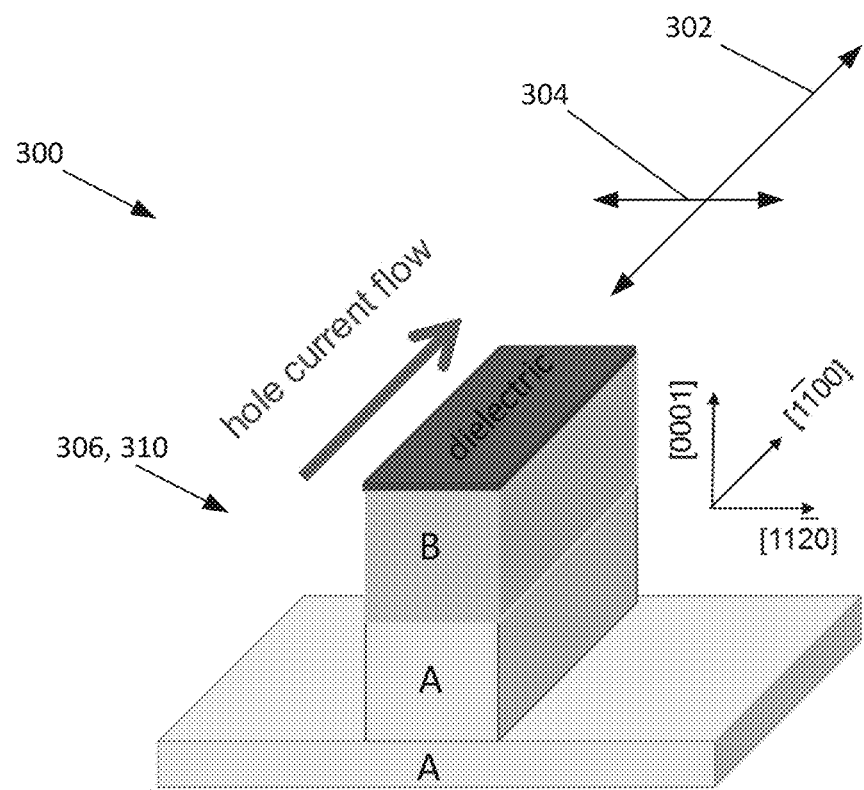
Figure 3F:
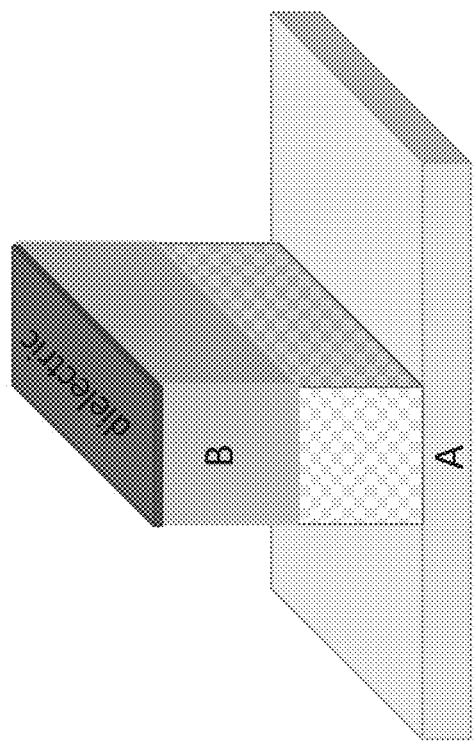
Figure 3F:
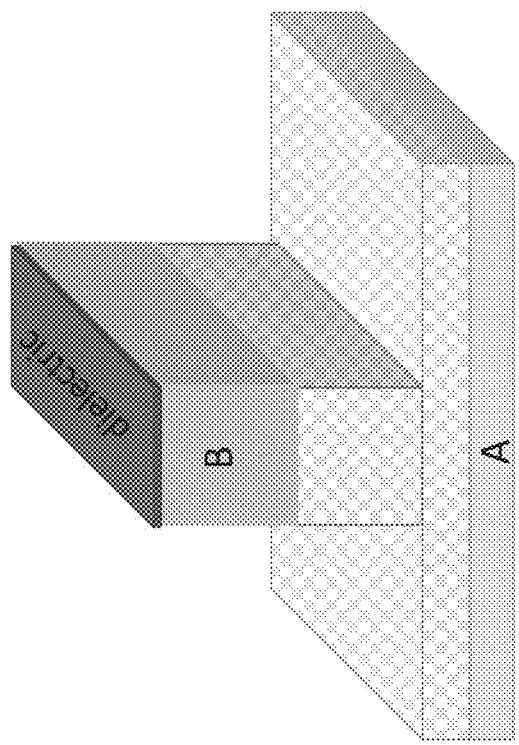

FIG. 3F illustrates example structures using porous GaN to aid the relaxation or partial relaxation of material B perpendicular to the fin direction to achieve uniaxial strain. Parallel to the fin along the long axis of the fin material B remains strained to material A or relaxes less compared to the direction perpendicular to the long axis of the fin. Thereby material B can be composed of multiple layers. Using porous GaN, the fin dimensions can be in the micrometer range.

4. Example Electronic Device Structures

FIG. 3b shows and example wherein the Channel comprising GaN has a lattice constant larger than the base material (e.g., AlGaN) so that the channel is under compressive strain. In another example, the structure is a uniaxial fin structure as shown in FIG. 3c where the direction of transport is in the [11$\bar{2}$0] or a-direction and the direction of relaxation is in the [1$\bar{1}$00] or m-direction (for example). This is for uniaxial compressive strain generated by GaN channels grown on AlGaN buffer layers for the embodiment shown.

Similarly, in the bulk of the stripe can be composed of GaN and the channel of InGaN, or any nitride material where the in-plane lattice constant of the bulk of the stripe is smaller than the in-plane lattice constant of the channel material. Thereby for epitaxial layers grown in the c or −c-directions, the stripes can run parallel to the [11-20] or [1-100] direction for light hole current flow to occur along the corresponding stripe direction in which the channel material is still compressively strained.

The channel is in general made of III-N materials which may be of uniform composition, graded or stepped composition, or any combination thereof. The buffer layers can also be of uniform composition, graded or stepped composition, or any combination thereof. The source drain spacing can be in the direction of low effective mass holes and the number of fins can be scaled to enhance device current requirements. The device structure shown has spacing between the gate and the drain to hold significant voltage.

Similarly, light holes form in fins composed of a group-III nitride material C which under relaxed conditions has an in-plane lattice constant smaller than the base material A. In this case, if the fins propagate along the [11-20] direction the light hole current flows perpendicular to the fins in the [1-100] directions. Here materials A and C could be, for example, GaN and (Al,Ga)N, respectively.

In one example, the light holes form in fins made from group-III nitride materials B grown on a base layer A in the c or (0001) or −c or (000-1) direction, when the relaxed in-plane lattice constant a of the base material A is smaller than that of the relaxed material B which is a constituent of the fins as illustrated in FIG. 3d. In the fin structure, material B is strained to material A along the fins, but B relaxes perpendicular to the fin. Thereby the fin propagation direction is [1-100] with a light hole current flow in devices, for example p-FETs, along the [1-100] direction of the fin. Here materials A and B could be GaN and InGaN, respectively. Alternately materials A and B could be AlN or AlGaN and GaN, respectively, with p-FET structure examples.

Figure 4:
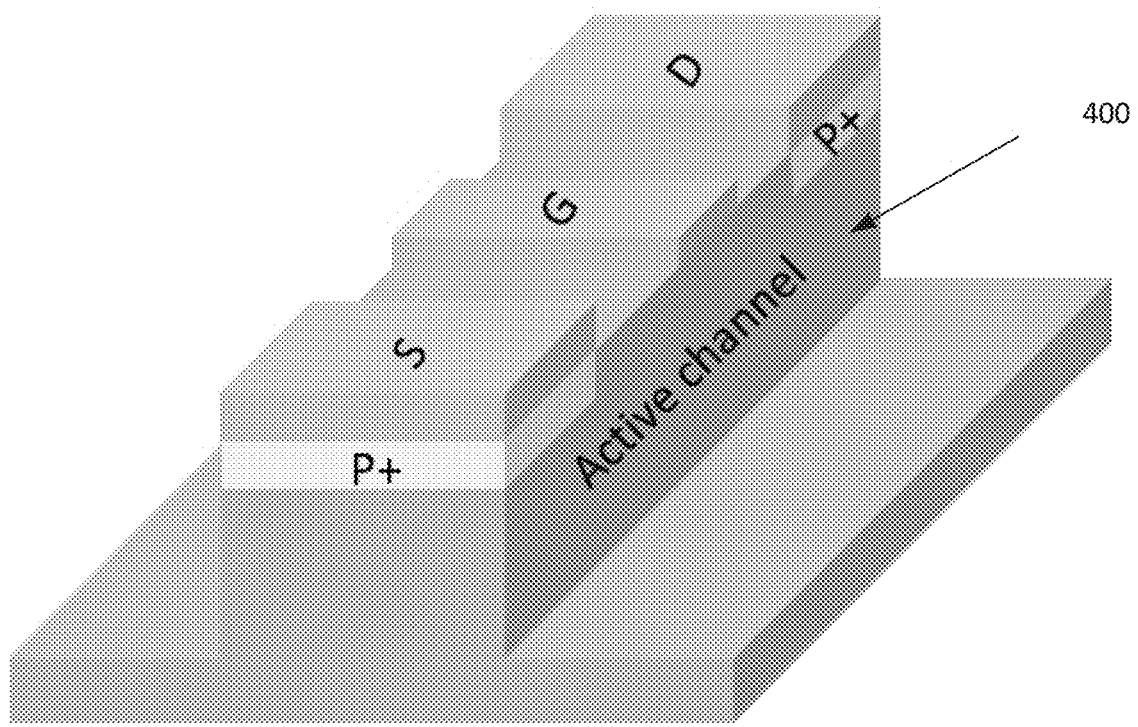
FIG. 4. Schematic showing a p-FET fabricated along the direction of low effective mass holes. The anisotropy in hole effective mass is induced by uniaxial strain existed along the fin.

A self-aligned p-FET structure such as shown in FIG. 4 can also be similarly fabricated. If the dimensions of the scaled gate are small (200 nm) the p-type source and drain regions may incorporate strained materials which can further modify the strain in the channel. In one embodiment the structure can be such that all the compressive strain in the channel can be exerted by the source and drain regions. In this instance the need to form a fin to create the uniaxial is ameliorated and the buffer design can be altered.

The impact of the stressor can be enhanced by placing the channel material on a porous group-III nitride material such as porous GaN, taking advantage of the reduced stiffness of porous materials. Similarly, incorporating porous group-III nitride material allows stressing the material over larger dimensions, eliminating the need for employing submicron structures.

5. Complementary Integrated Circuits (CMOS) Using III-N Materials

Figure 5:
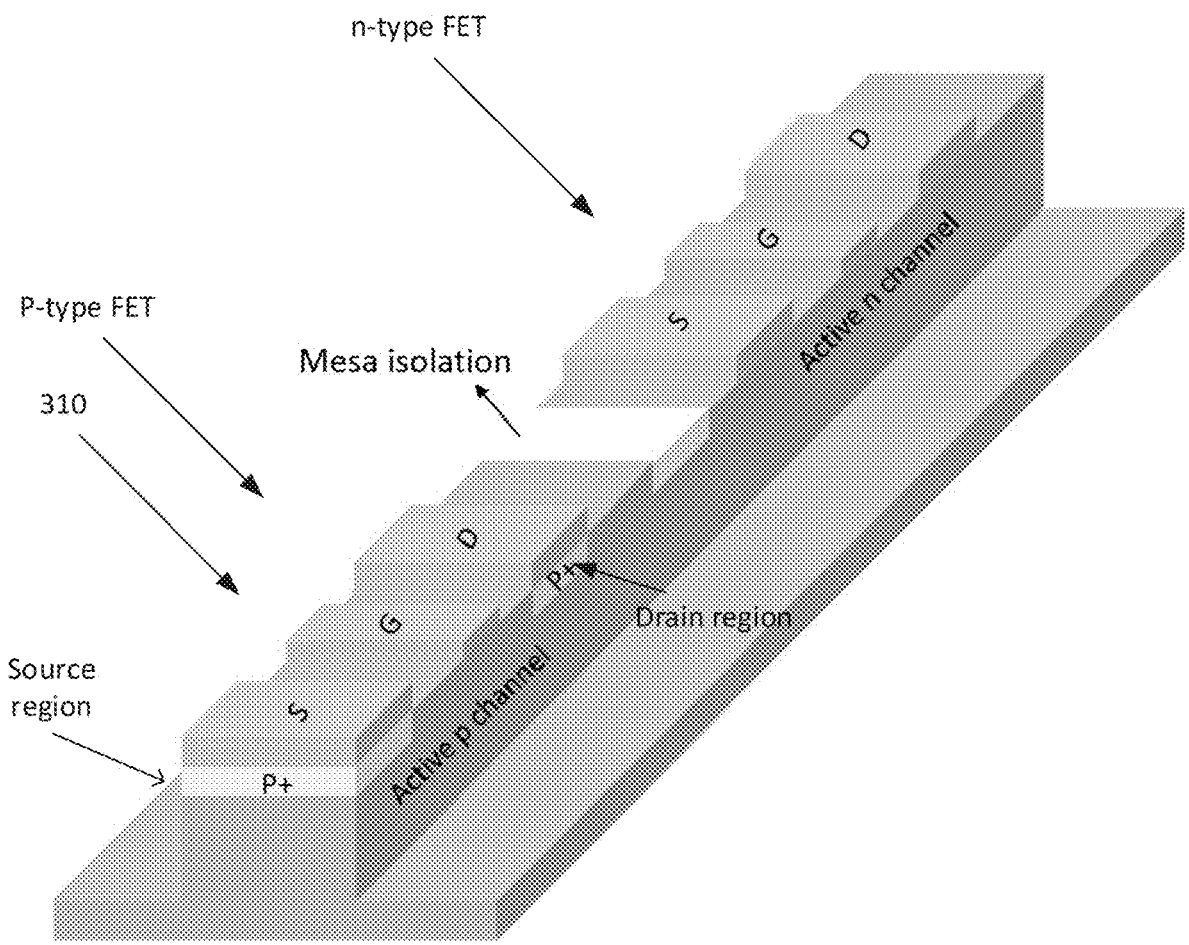
FIG. 5. Schematic of p-FET and n-FET implemented on the same substrate, both along the fin direction.
Figure 6:
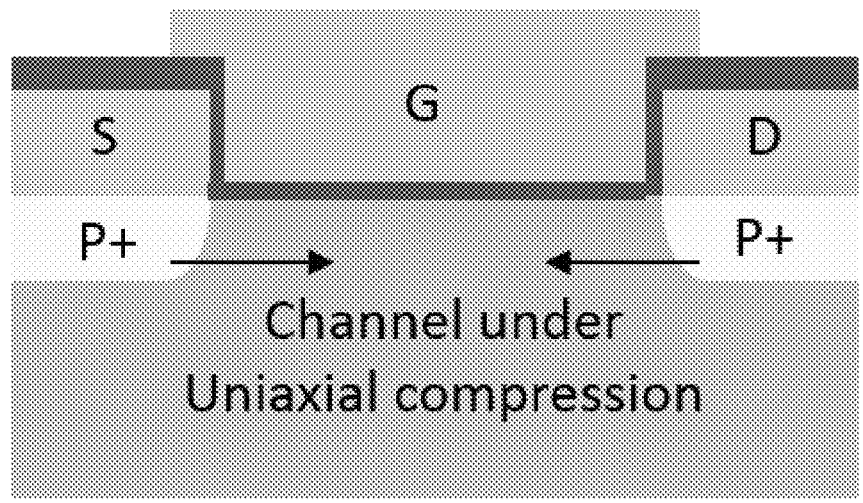
FIG. 6. p-FET and n-FET structures showing use of stressor and p+ regrowth to induce uniaxial compression to the p-channel.
Figure 6:
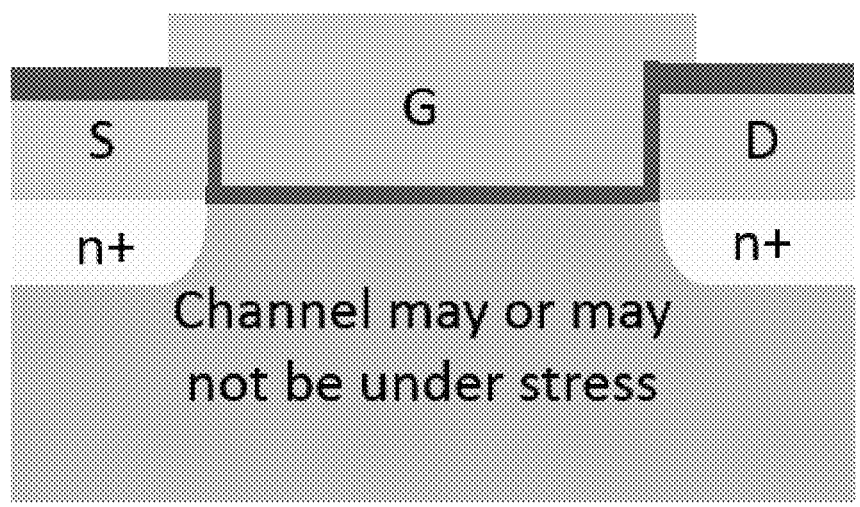

CMOS architectures are by far the dominant architecture in Si today. CMOS in GaN has not been attractive because of the limitations of the p-MOSFET in GaN. Using the light hole channels as described herein will enable a high-performance GaN p-MOSFET. This will allow CMOS architectures where both the n-type and p-type devices are collocated on the same substrate. One embodiment is shown in FIG. 5. The n-FET and p-FET devices can be both oriented in the same direction on the fin as shown in this figure. This is because although the hole effective mass is reduced in the fin direction (as explained earlier in FIG. 4), the electron effective mass remains substantially the same and hence the n-FET performance will be similar to the conventional GaN n-FETs. In FIG. 6 the devices can be co-located on a wafer where the strain is applied only to the p-channel device using stressors generated either with source drain materials or by dielectric stressors or both. The impact of the stressor can again be enhanced by incorporating porous GaN into the structure.

6. Bipolar Transistors:

Uniaxial tensile strain in the x direction causes the hole effective mass to reduce in the y-direction as in ref [1]. Similarly, tensile strain in the y direction results in a lowering of the effective mass for hole transport in the x-direction (e.g. light hole transport occurs in the direction orthogonal to the direction of the uniaxial tensile strain). Using this principle, we propose a device shown in FIG. 7, wherein the base contacts are in the short direction of the fin when the base is placed under uniaxial tensile strain. The base current flows in a direction perpendicular to the fin. In this case, the III-N buffer layer on which the active materials are grown could be of a larger lattice constant such as InGaN or another material to induce tensile strain on the overlying materials.

Figure 8A:
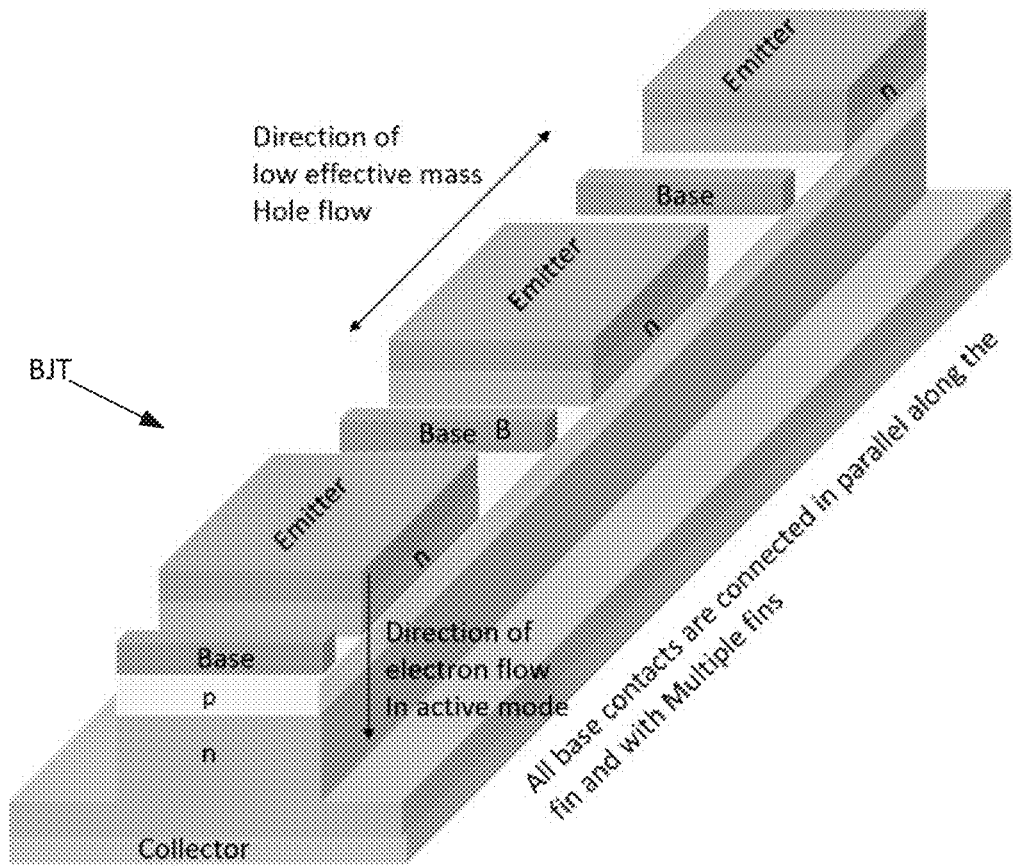
Figure 8B:
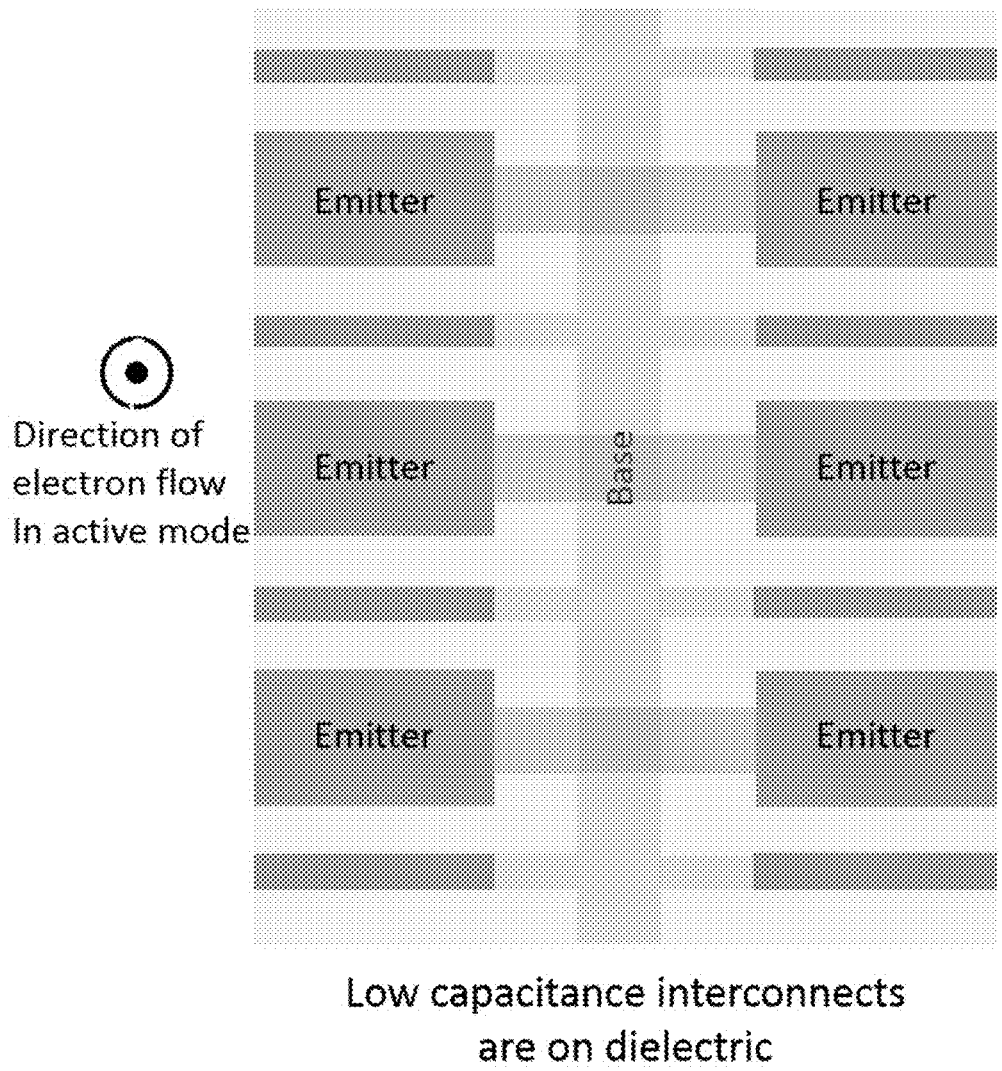

Uniaxial compressive strain can also be employed to enhance III-N-based bipolar transistors as shown in FIG. 8. In this embodiment, a grid like structure is used with a two-level metal scheme. Level 1 metal interconnects the emitter layers and level 2 metal interconnects the base layers. The collector metal here is assumed at the back of the wafer, otherwise a third level interconnect (level 3) can be used to interconnect the collector regions. The base current is in the direction of the fin. In this case, the III-N buffer layer on which the active materials will be grown could be of a smaller lattice constant such as AlGaN or another material to induce tensile strain on the overlying materials.

B. Enhanced Relaxation of Materials and Device Structures Based on the Same

1. Introduction

Figure 9:
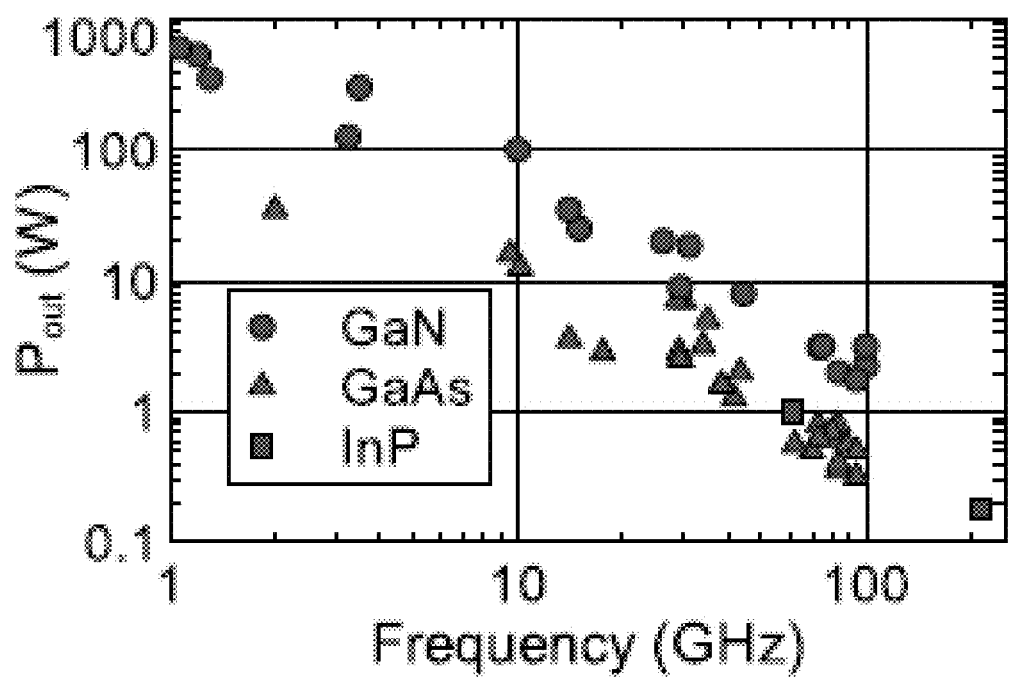
FIG. 9. Output power vs Frequency.
Figure 10:
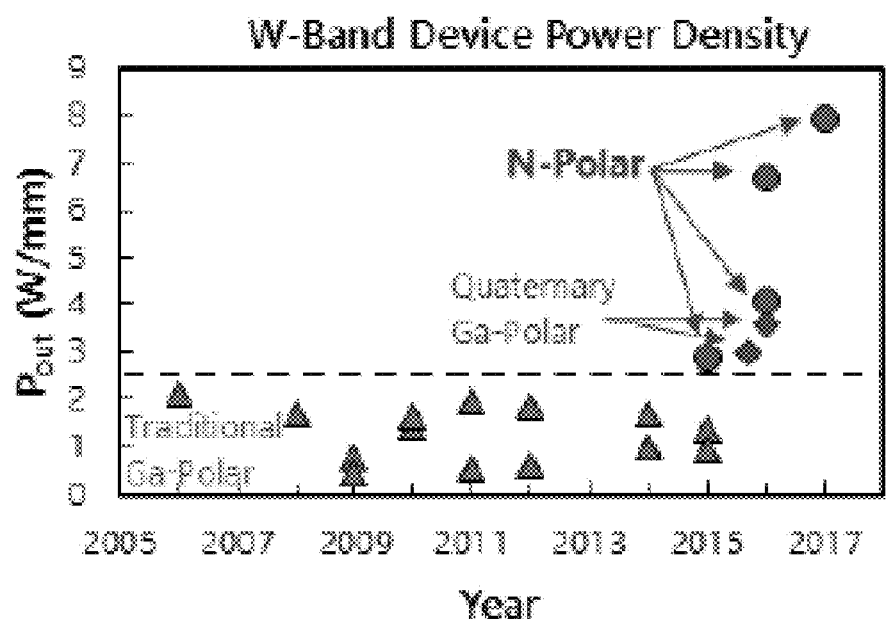
FIG. 10. W-Band output power density of various GaN device technologies over time. Traditional AlGaN/GaN HEMTs have saturated around 2 W/mm while N-polar GaN has recently demonstrated 7.94 W/mm.
Figure 11:
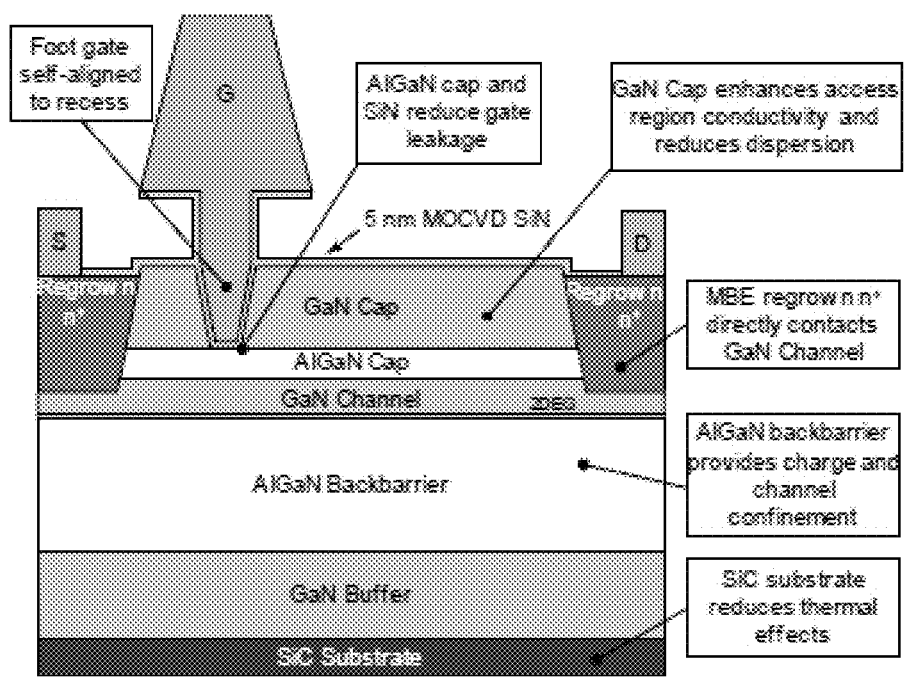
FIG. 11. Device Cross-section schematic of the N-polar GaN Deep Recess MISHEMT structure. Key properties of the device structure are highlighted.

The intrinsic material properties of GaN, with its combination of large critical electric field and high electron mobility, provide an ideal platform to fabricate devices for high power millimeter-wave power amplifiers. As shown in FIG. 9, traditional Ga-polar AlGaN/GaN devices have demonstrated superior power performance over a wide frequency range when compared to alternative device technologies. However, when examining reported device performance in W-band over the past decade, one observes that the power density of traditional GaN HEMTs has been saturated at 2 W/mm (FIG. 10) with power-added efficiencies (PAE) limited to about 25%. To break this barrier a technology had to be developed that simultaneously provided high current, high breakdown voltage and low dispersion without paying the penalty of reduced gain caused by the capacitance of field plates; a very high price to pay at mm-waves. The deep recessed N-polar AlGaN/GaN structure grown on miscut SiC shown in FIG. 11 succeeded because of it provided low channel resistance and low dispersion because of the GaN cap and a high gate breakdown because of the reverse polarization field of the AlGaN under the gate. This has resulted in a power density of 7.94 W/mm at 94 GHz with a PAE of 26.9%.

2. Example

Figure 12:
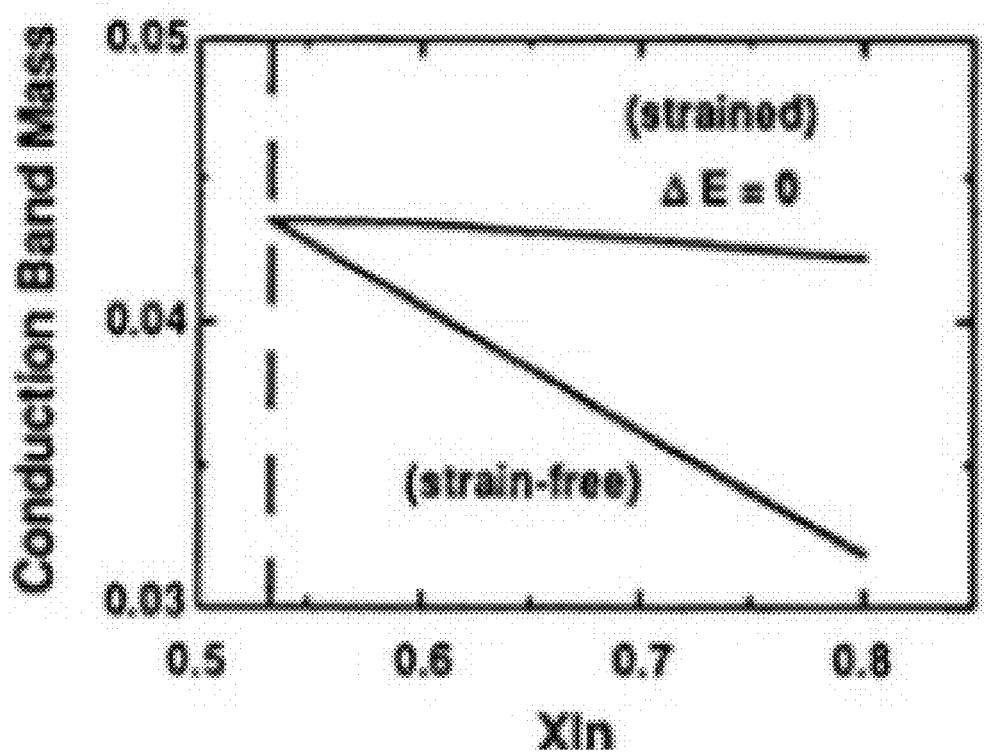
Figure 13:
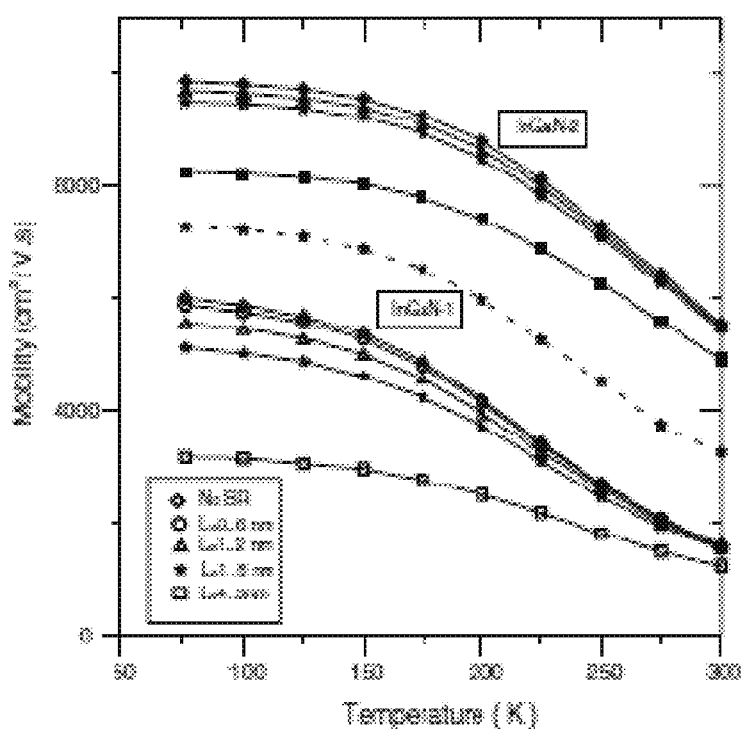
FIG. 13. Electron mobility in $In_{0.2}Ga_{0.8}N$ film sandwiched between two GaN layers. InGaN-2 and InGaN-1 are electron mobility calculated assuming m*=0.04 and m*=0.07 for InN, respectively. From Z. Yarar et al, Journal of ELECTRONIC MATERIALS, Vol. 36, No. 10, 2007
Figure 14:
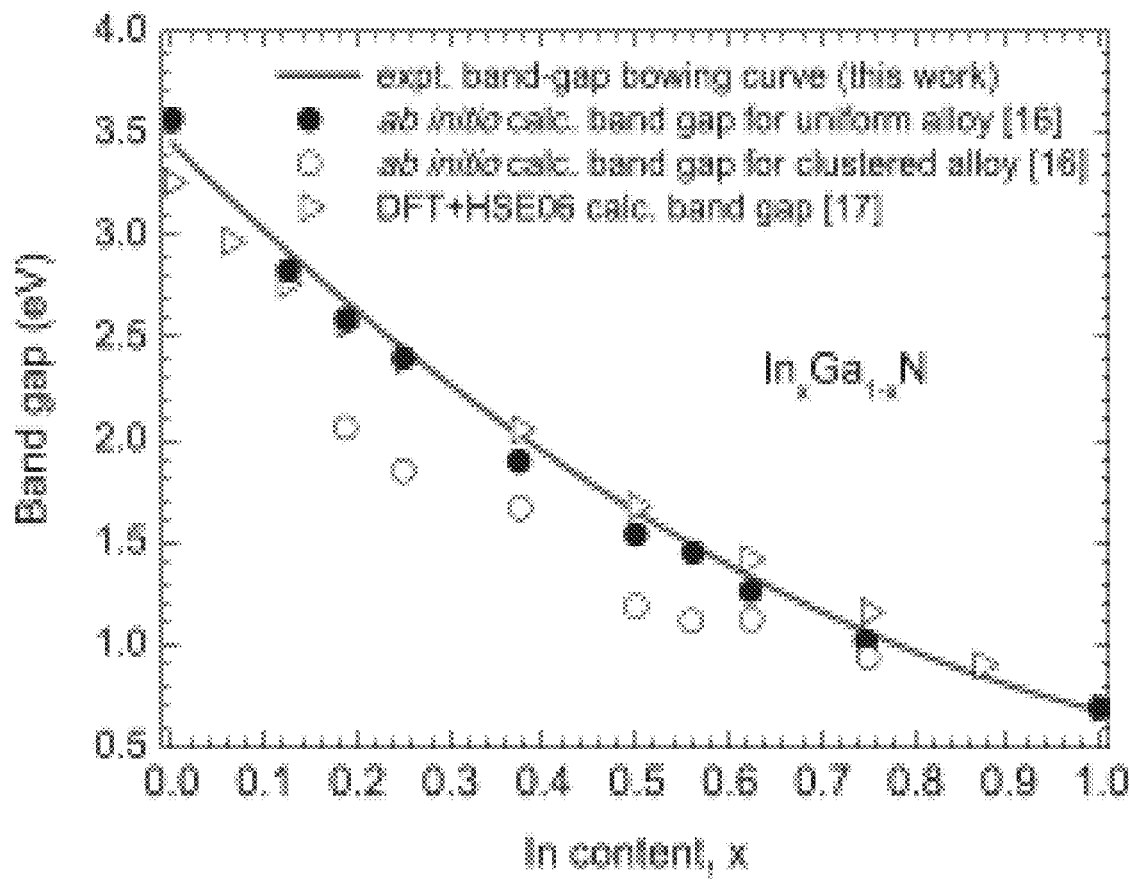
FIG. 14. Bandgap of InGaN versus In composition. From E. Sakalauskas et al., Phys. Stat. Sol. B 249 (2012) 485.
Figure 15:
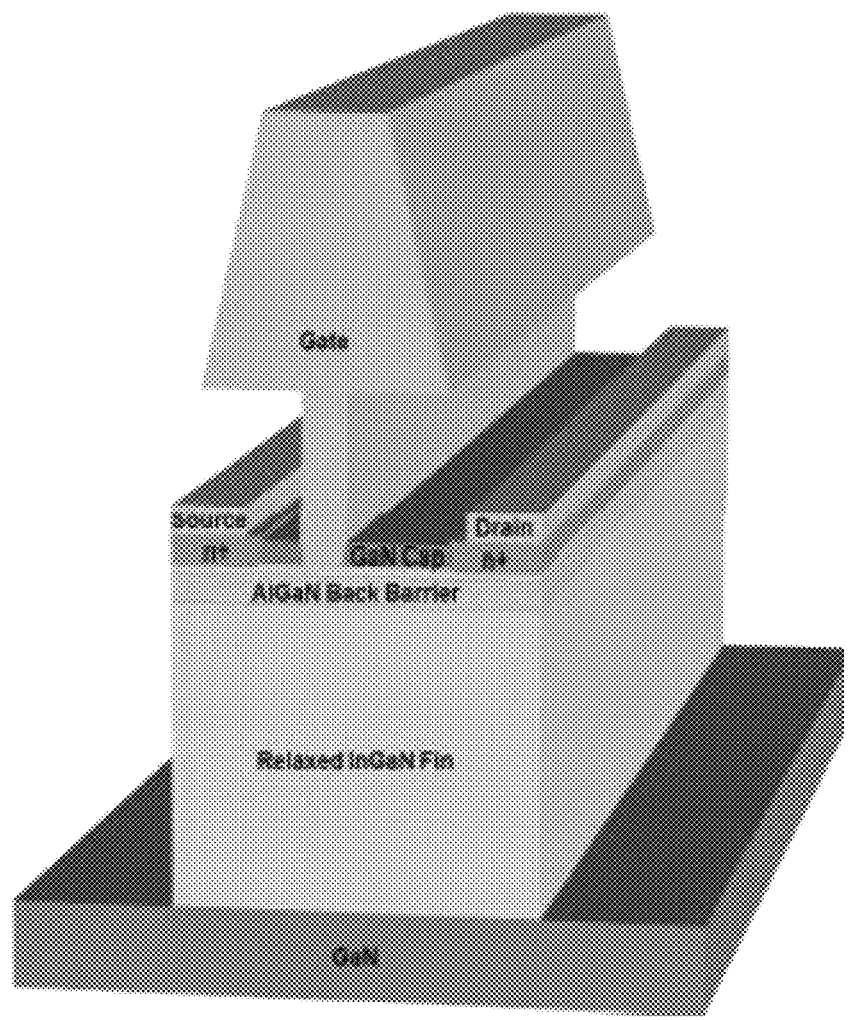
FIG. 15. Schematic of the proposed structure.
Figure 16:
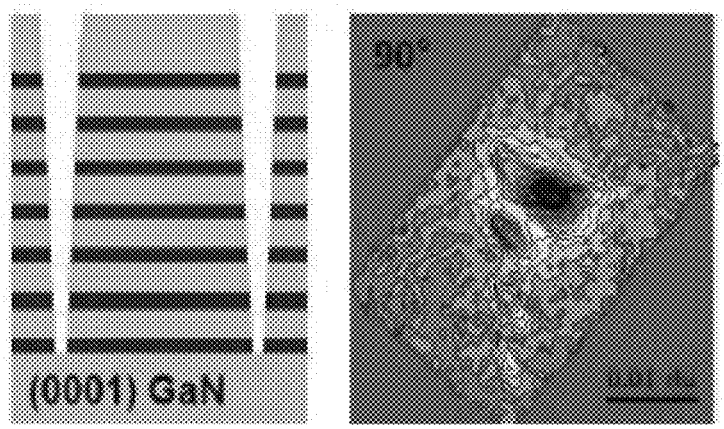
FIG. 16. Left: Schematic of stripe patterned InGaN/GaN MQW, right: reciprocal space map of stripe patterned MQW sample taken around the asymmetric (11$\bar{2}$4) reflection with x-ray scattering plane perpendicular to the stripe direction showing relaxation of the MQW.

The present disclosure describes how to increase the electron velocity in the channel by using relaxed InGaN as the channel material which provides a reduced electron effective mass, critical in reducing electron scattering and enhancing electron velocity. Relaxation of the InGaN channel is required since a fully strained InGaN channel does not provide an effective mass commensurate with the In mole fraction because the lattice constant and hence the Brillouin Zone and conduction band curvature of the InGaN is more akin to GaN, as previously observed for strained and relaxed InGaAs (FIG. 12) [7]. The 2DEG mobility in an $In_{0.2}Ga_{0.8}N$ channel, as shown in FIG. 13 has been as predicted to be more than 5000 $cm^2/Vs$ as calculated by Yarar et al [11]. This composition is attractive as the bandgap of InGaN is still around 2.5 ev (FIG. 14) which enables high frequency operation with high voltage operation along with high current. At one limit of composition electron mobility values as high as 3570 $cm^2/Vs$ were measured for InN films with an electron carrier density of $1.5 \times 10^{17}$ $cm^{-3}$ compared to values around 600 $cm^2/Vs$ for GaN films with similar carrier densities [8]. We achieve the InGaN relaxation in a unique manner by using Fin geometries of nominal 200 nm width which allow an N-polar InGaN layer or GaN/InGaN/GaN stack to relax to their average lattice constant after patterning. The proposed structure is shown in FIG. 15 using the N-polar orientation of the III-N material as the preferred orientation. By relaxing the InGaN in the direction of electron transport, the electron effective mass is determined by the relaxed lattice constant. We have shown the effectiveness of patterning to relax Ga-polar nano-stripes of InGaN/GaN multi quantum well structures using X-ray analysis (FIG. 16) [9-10]. This technique is applicable to all materials (beyond III-N materials) in all polarities and crystal planes.

Figure 17:
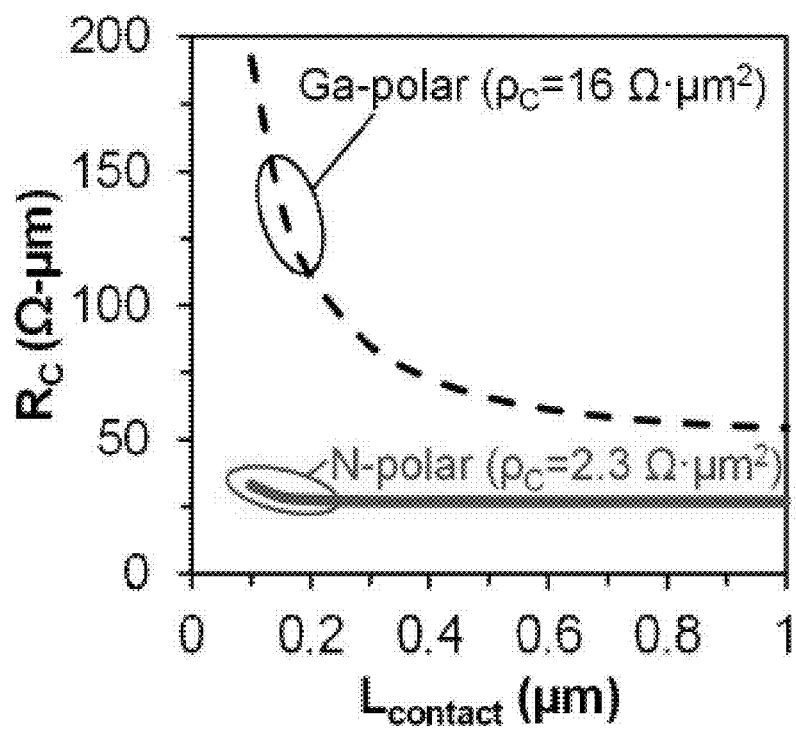
FIG. 17: Illustration of variation in contact resistance for finite-length contacts, using best reported values for GaN HEMTs [HRL], [Sansaptak]. Includes 0.026 Ω-mm n+ to 2DEG interfacial contact resistance for Ga-polar [HRL].
Figure 18:
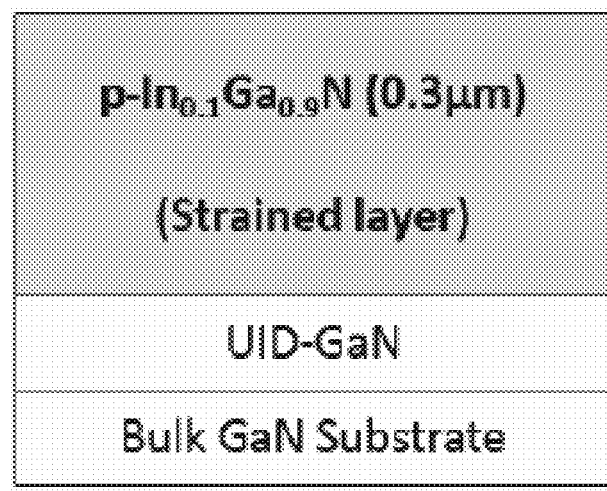
FIG. 18. Cross-sectional schematic of strained InGaN layer on GaN

In contrast to a FinFET, the channel in this device the electron transport direction is perpendicular to the fin direction. For small fin dimensions ohmic contacts with sub-micron length are required. For these contacts an extremely low specific contact resistivity ($\rho_C$) is needed. In the preferred embodiment using N-polar III-N orientation, record values of GaN HEMT contact resistance ($R_C$) of 27 Ω-μm, corresponding to $\rho_C$ of 2.3 Ω-μm$^2$, have already been demonstrated in a full N-polar GaN HEMT process. It utilized a regrown structure with the GaN channel graded to $In_{0.63}Ga_{0.37}N$ capped with InN. The InN has been shown to exhibit surface electron accumulation of ~$10^{13}$ cm$^{-2}$ density, ideal for low resistivity contacts to metal. The graded InGaN was used to minimize the barrier due to conduction band discontinuity between the channel and InN. For N-polar this graded region also creates a positive polarization charge which then gives rise to a 3-dimensional electron gas (3DEG), which reduces the barrier at the InN/$In_{0.63}Ga_{0.37}N$ interface and reduces sheet resistance of the contact layer. The second unique benefit of the N-polar orientation is that the HEMT's 2DEG is induced from the back-barrier, so contact to the 2DEG is formed over the entire contact area, and not merely at the edge of the ohmic region (FIG. 17). Appropriate contact materials will simultaneously reduce contact resistance and preferably enhance the relaxation of the channel. While the uniaxial strain conditions described in the examples hold for epitaxial layer structure grown in the (0001) or c-direction as well as in the (000-1) or –c-direction, other strain conditions can be used in devices grown in non-c-plane directions.

3. Circuit Modules

Exemplary n channel and p-channel devices can be implemented in digital CMOS architectures, analog circuits such as push-pull amplifiers, wideband amplifiers and mixed signal architectures.

4. Results

In our work, for the first time, we experimentally demonstrate the improvement in hole conductivity under the application of uniaxial compressive strain in c-plane III-Nitrides. We obtained approximately 25-50% lower sheet resistance ($R_{SH}$) extracted from TLM measurements at room temperature (295 K) with uniaxially strained InGaN layers compared to planar biaxially strained InGaN layers.

Figure 19:
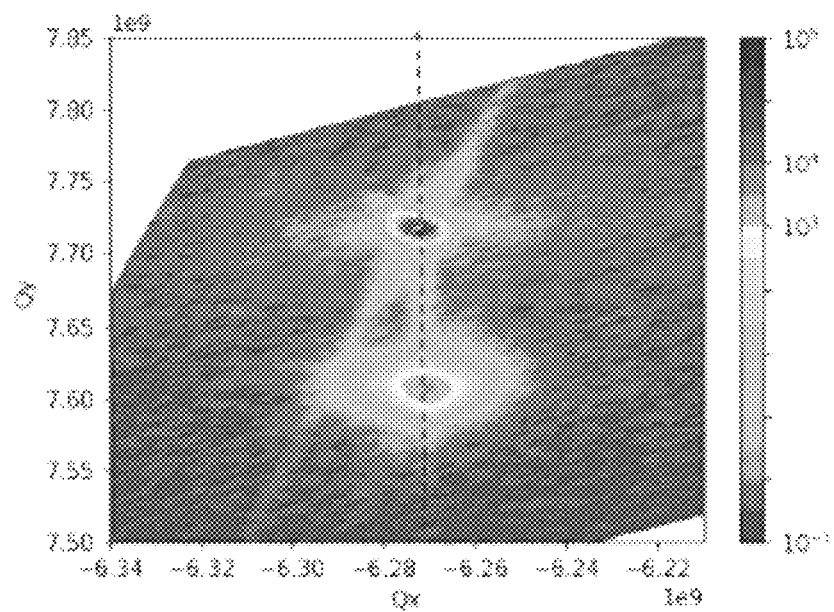
FIG. 19. Post growth reciprocal space map for fully strained InGaN layer sample. The alignment of GaN peak (above) and InGaN peak (below) shows the fully strained state of the InGaN layer.
Figure 20:
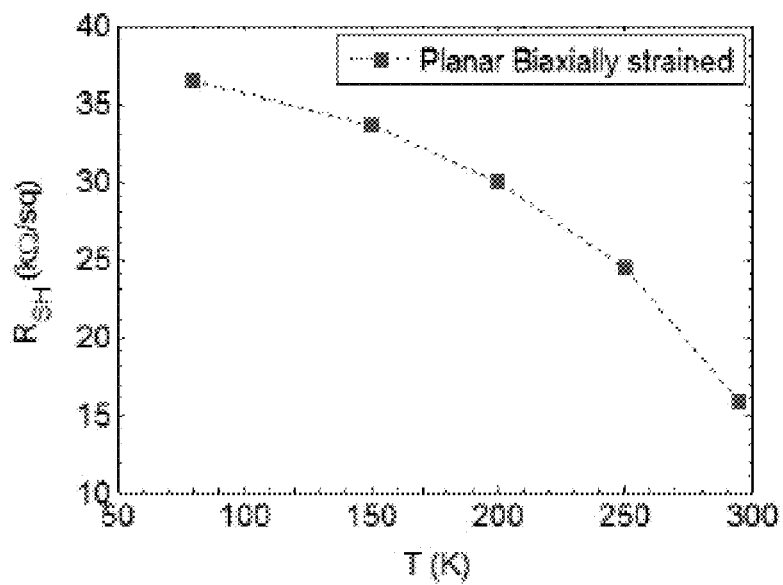
FIG. 20. Hole conductivity as a function of temperature for planar biaxially strained InGaN layer. The increase in $R_{SH}$ can be attributed to the freezing of holes in the bulk InGaN layer with reduced temperatures. The presence of 2-DHG at the InGaN/GaN interface results in the observance of reasonable sheet resistance values at 80K.
Figure 21:
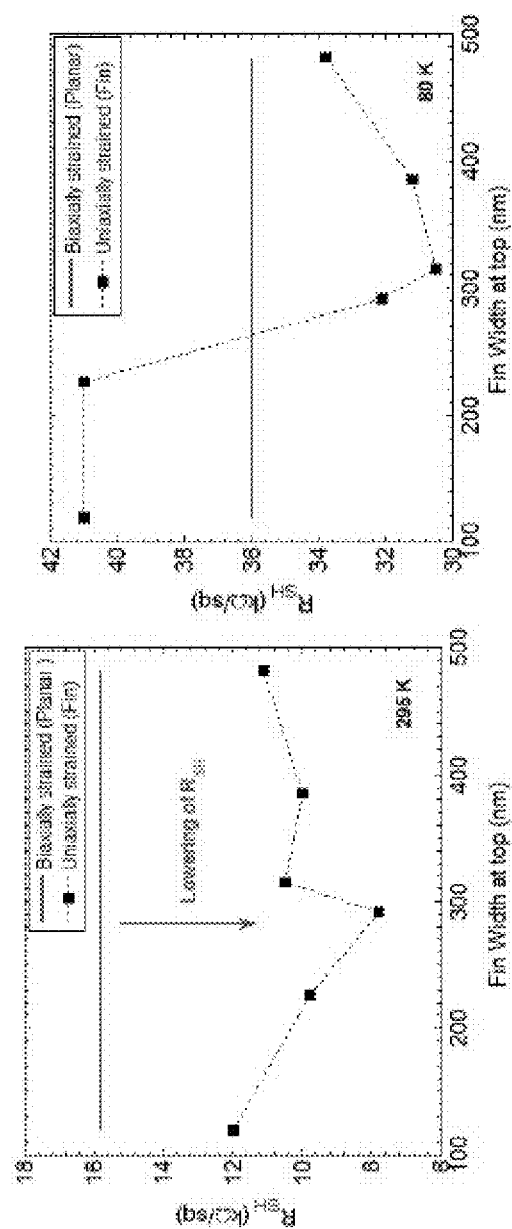
FIG. 21. (Left) Uniaxially strained layers (fins) demonstrated lower $R_{SH}$ (~25-50% lower) compared to planar biaxially strained layers at the room temperature. (Right) However, the difference in the $R_{SH}$ was almost negligible at 80 K. These results indicate that at the InGaN/GaN interface strain-relaxation was not achieved. These results demonstrate the use of strain engineering (for the first time) to improve the transport properties of holes by changing the valence band-ordering in III-Nitrides.

Fully strained (as observed from reciprocal space map) 300 nm thick, Mg ($3\times10^{19}$ cm$^{-3}$) doped $In_{0.1}Ga_{0.9}N$ layers were grown on bulk GaN substrates (FIG. 1 and FIG. 2). The $R_{SH}$ of planar biaxially fully strained InGaN layer increased from 16 kΩ/☐ (at 295 K) to 36 kΩ/☐ (at 80 K) at low temperature (FIG. 19). The increase in $R_{SH}$ can be attributed to the freezing of holes at low temperature in the bulk p-InGaN layer, however, the presence of 2-DHG at the InGaN/GaN interface results in reasonable $R_{SH}$ at 80 K (~36 kΩ/☐).

Figure 22:
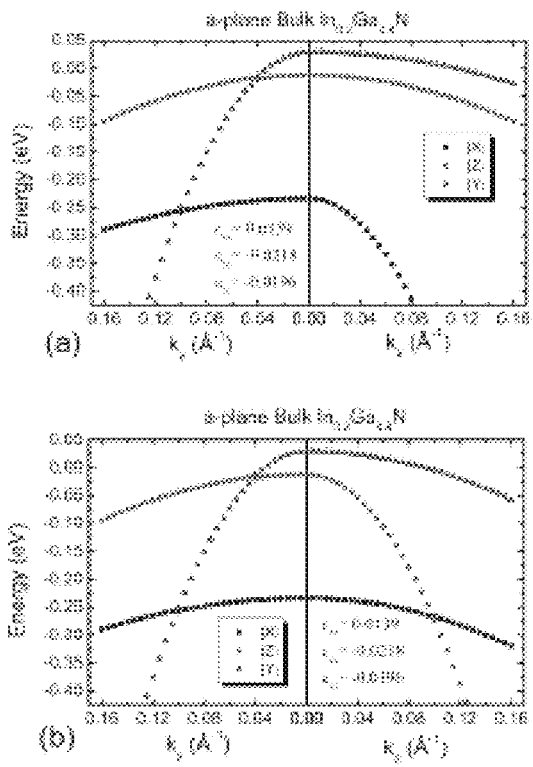

Fin structures were fabricated with fin-widths ranging from 100 nm to 500 nm to obtain uniaxial compressive strain in the longitudinal direction as the fin relaxes in the transverse direction. Uniaxially strained layers (fins) demonstrated lower $R_{SH}$ (~25-50% lower) compared to planar biaxially strained layers at the room temperature (FIG. 22). However, the difference in the $R_{SH}$ was almost negligible with lower temperature (80 K). These results indicate that at the InGaN/GaN interface, strain-relaxation was not achieved in the transverse direction.

These results demonstrate the use of strain engineering (for the first time) to improve the transport properties of holes by changing the valence band-ordering in III-Nitrides.

C. Non-Polar/Semi-Polar Examples

Unisotropic strain also exists in planar layer structure grown in the non-polar a- and m-directions and semi-polar directions of the nitride wurtzite crystal, leading to a splitting of the valence bands into heavy hole and light hole bands. For example, in optoelectronic devices based on m-plane InGaN/GaN heterostructures, this leads to polarized light emission. In these the heavy hole band moves in the highest energy position among the valence bands. However, when a group-III nitride material B with a larger lattice constant than the base material A is grown strained on top of material A in the a- or [11-20] direction, on a-plane substrates, for example, the light hole band moves again in the highest position among the valence bands and allows light hole current flow in the [1-100] direction (FIG. 22). Conversely, when material B with a larger lattice constant than the base material A is grown in the [1-100] or m-direction on m-plane substrate, the light hole band moves in the highest position along the [11-20] direction. Materials A and B can, for example, again be GaN and InGaN, respectively, or AlN or AlGaN and GaN, respectively.

Figure 23:
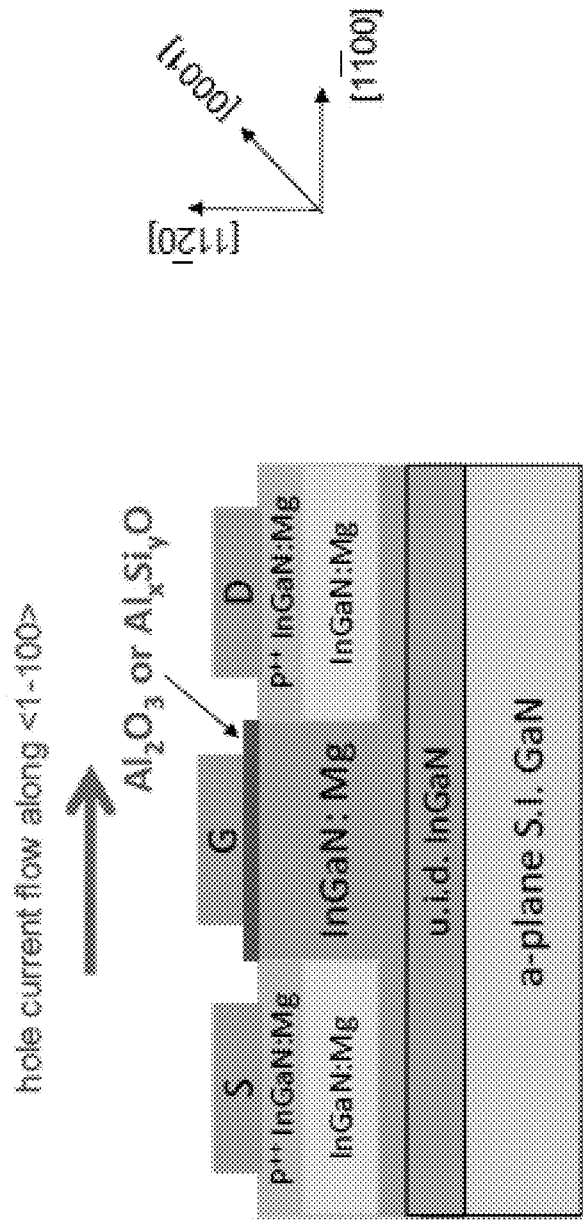
Figure 24:
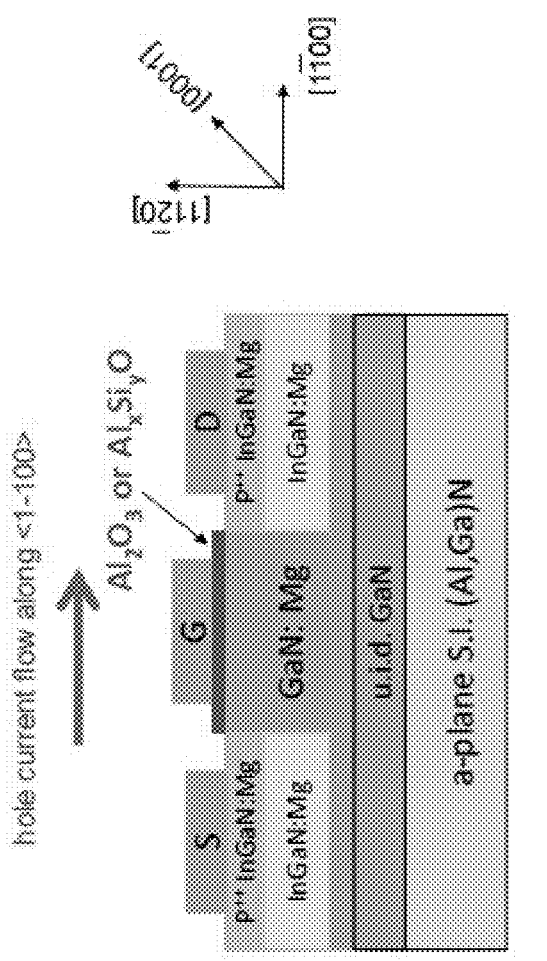

Utilizing planar a-plane GaN or AlN substrates, planar p-FETs are fabricated with source and drain contacts aligned in such a way that the current flows along [1-100]. Examples for planar a- or m-plane InGaN/GaN and GaN/(Al,Ga)N p-FETs are illustrated in FIGS. 23 and 24.

Thereby in one example, a p-type Mg doped $In_xGa_{1-x}N$ layer will be deposited on a a-plane GaN substrate which can be of any conductivity, but preferentially semi-insulating.

Gate, source and drain p-type contacts are then fabricated in the preferred direction for MESFETs. To improve the contact formation a p++-InGaN layer can be implemented for contact formation, and re-grown p-type InGaN contacts can be used as illustrated in FIG. 25. Thereby the In composition in the re-grown contacts and/or in the p++ InGaN contact layer can be higher than in the InGaN p-channel layer. In addition a dielectric such as aluminum oxide or silicon aluminum oxide can be utilized under the gate.

Instead of a single p-type Mg doped $In_xGa_{1-x}N$ layer thin Mg doped and undoped $In_xGa_{1-x}N$ layers can be alternated. Thereby the Mg doped $In_xGa_{1-x}N$ layers can be of lower In composition x compared to the undoped $In_yGa_{1-y}N$ layers, and the number of doped and undoped layers can vary (FIG. 26)

The $In_xGa_{1-x}N$ and $In_yGa_{1-y}N$ layers can be arranged in such a way, that one or more a two dimensional hole gas channels form.

The doped layers can be formed through delta doping.

The a- or m-InGaN/GaN p-FET can be integrated with n-FETs, for example via selective area deposition.

Figure 27:
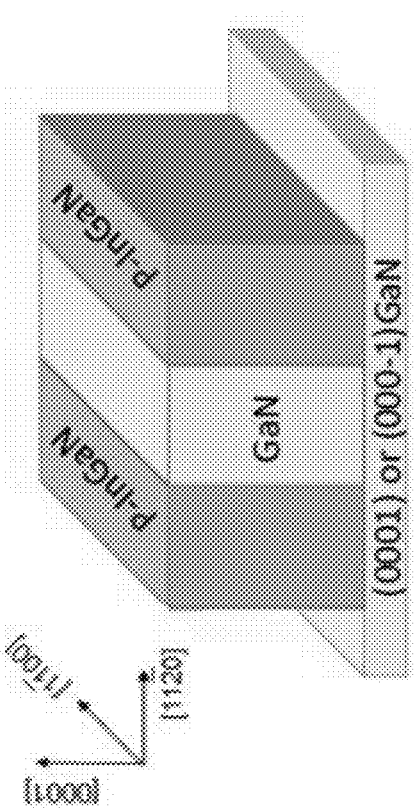

Instead of the planar a- or m-plane p-FET structures, the p-FETs can be grown on the a-plane or (11-20) sidewalls (or m-plane or (1-100) sidewalls) of fins or ridge structures fabricated on (0001) or (000-1) GaN base layers. C-plane GaN is available in much larger diameters and the fin or ridge structures also allow the integration of p-FETs with n-FETs. In this case the above discussed planar a-plane heterostructures are deposited on the a-plane sidewalls of fins along the [11-20] direction as shown in FIG. 27.

Figure 28:
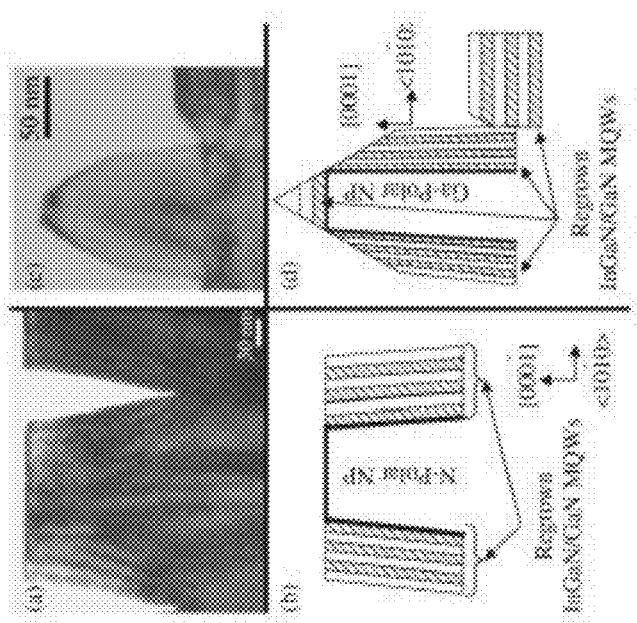
Figure 29:
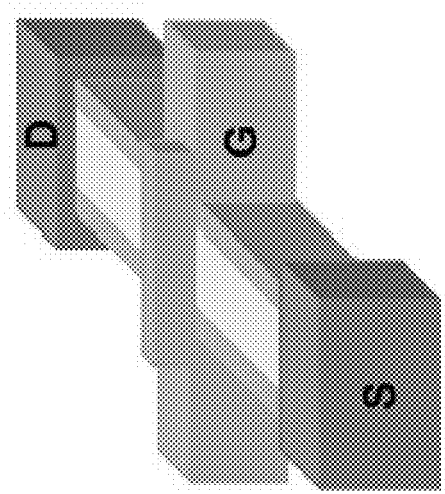

Using p-InGaN/GaN structures as example, the InGaN can be forced to grow on the a-plane sidewalls by masking the (0001) or (000-1) surface areas prior to InGaN deposition. In the case of (000-1) fins, the growth rate in the a-direction is naturally higher compared to the one the (000-1) plane, similar to the observations for the growth on the m-plane sidewalls as illustrated in FIG. 28. Thereby prior to the InGaN or p-InGaN layers a GaN or other suitable interlayer can be deposited. P-FETs can then be fabricated by wrapping the fins with the source, drain, and gate contacts as illustrated in FIG. 29. Alternately, contacts can be made to each side of the fins or ridges individually.

Figure 30:
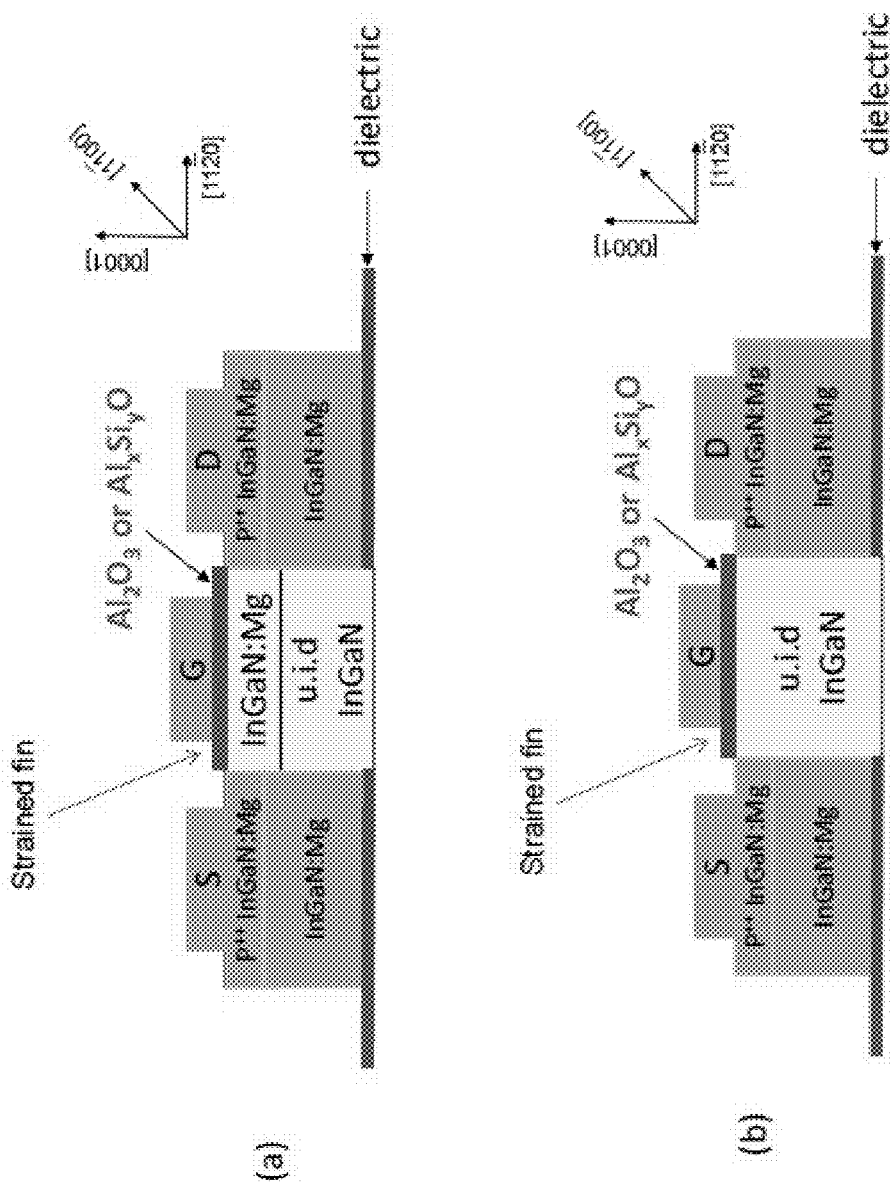
Figure 31:
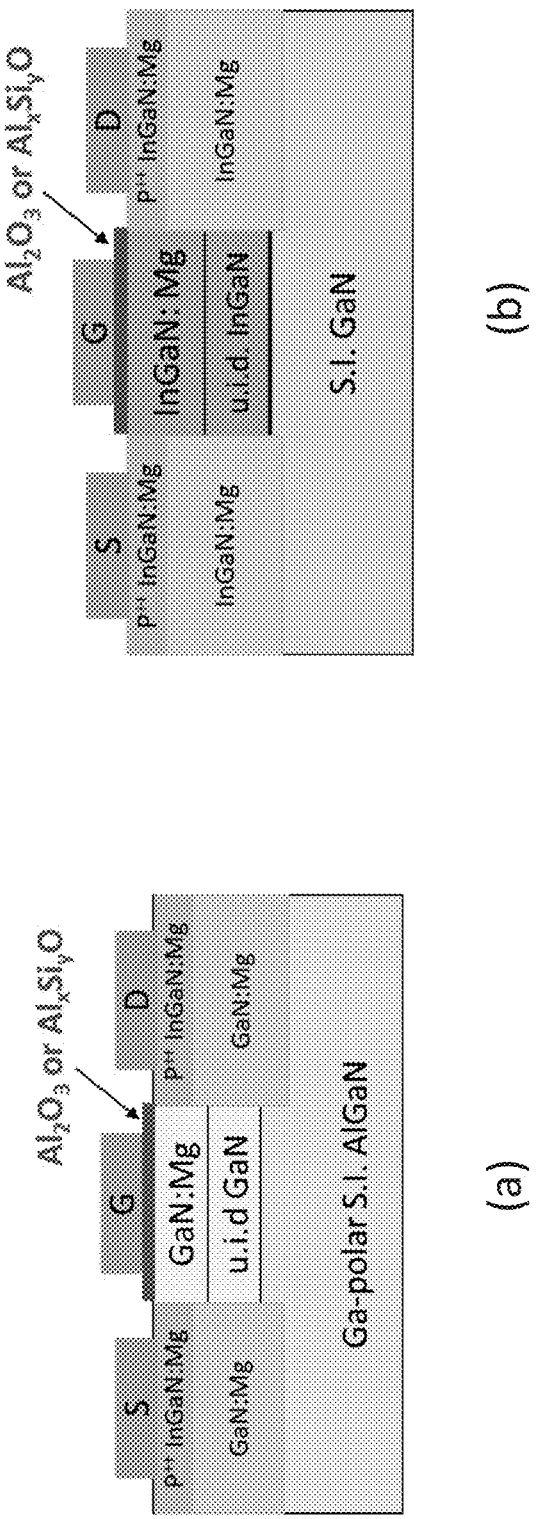
Figure 31C:
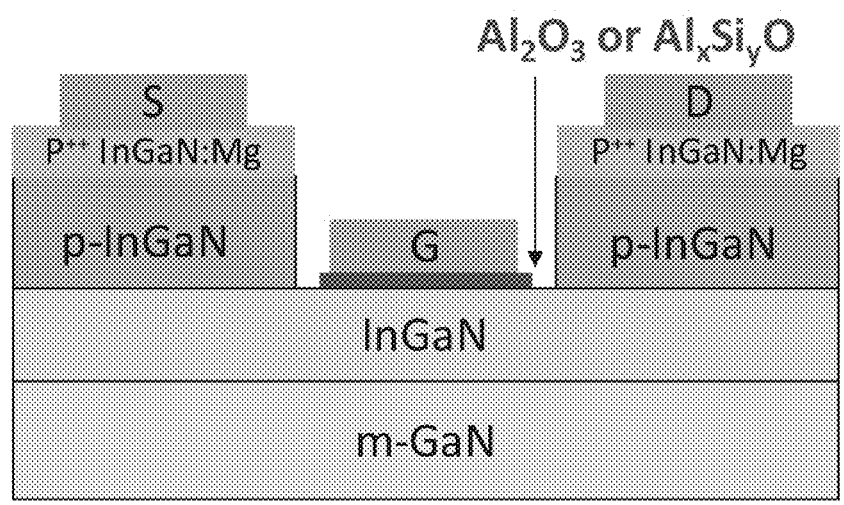

In addition, the properties of compressively strained materials on the a-plane orientation can be taken advantage of, for example, for the above discussed strained fin structures. Here an improved device performance is expected when the p-contacts are made of p-InGaN:Mg at the end of the fin structures, where the fins propagate along the [1-100] or m-direction and p-InGaN contacts are grown on the (11-20) sidewalls of the fins. (FIG. 30) For all applications, all directions can be rotated by 90 degrees.

The planar p-FETs and the p-FET fins can be integrated with planar n-FETs or fin n-FETs for CMOS architectures, which are by far the dominant architecture in Si today. CMOS in GaN has not been attractive because of the limitations of the p-MOSFET in GaN. Using the light hole channels as described herein enables a high-performance GaN p-MOSFET. This allows CMOS architectures where both the n-type and p-type devices are collocated on the same substrate.

The epitaxial layer structures can be grown by MOCVD or MBE or any other technique suitable to deposit III-N or (B,Al,Ga,In)N materials. The device shown is one in which a substantial voltage (>2V) is held in the source drain direction when the device is in the off-state. For ease of presentation the structures shown in FIGS. 5 to 8 are a depletion mode devices and represent the voltage bearing section of the p-FET. The oxide dielectric layers help to reduce gate leakage and thereby enhance the device breakdown performance. A normally-off gate module is achieved by etching the doped region under the gate and applying the MOS gate structure, for example, as illustrated in FIG. 13. The dielectric material can be deposited by any suitable technique including but not limited to using an MOCVD oxide growth process for the deposition of $Al_2O_3$ and $Al_xSi_yO$ (and $Si_3N_4$) dielectric materials. Thereby any dielectric material can be used, which can be deposited using any suitable technique.

For all applications, regrown InGaN:Mg or GaN:Mg/InGaN:Mg contacts may be used to minimize the contact resistance.

In all described cases the preferred orientation of the pFET channel is in the direction in which the very light hole effective mass available This enables, in one embodiment, the source drain spacing required to hold voltage in a power pFET to exist in the direction of the low hole effective mass. In another embodiment, the source drain spacing could be such that the FET is self-aligned as in conventional digital MOSFETs. The range of effective masses in GaN and AlN are shown in table I. The light hole effective mass, $m_{lh}$, is predicted to be in the range $0.14m_o$, which is even lower than the electron effective mass. We can use either a strained planar technology or strained fin structures, or strained heterostructures grown on the sidewalls of fins or ridges, or use these advantages for source drain regrowths, when applicable. The application of anisotropic in-plane strain to get high performance p-FETs is an exciting pathway of developing complementary GaN technology.

D. Examples for Light Hole Creation Using Biaxial Tensile Strain

Figure 32:
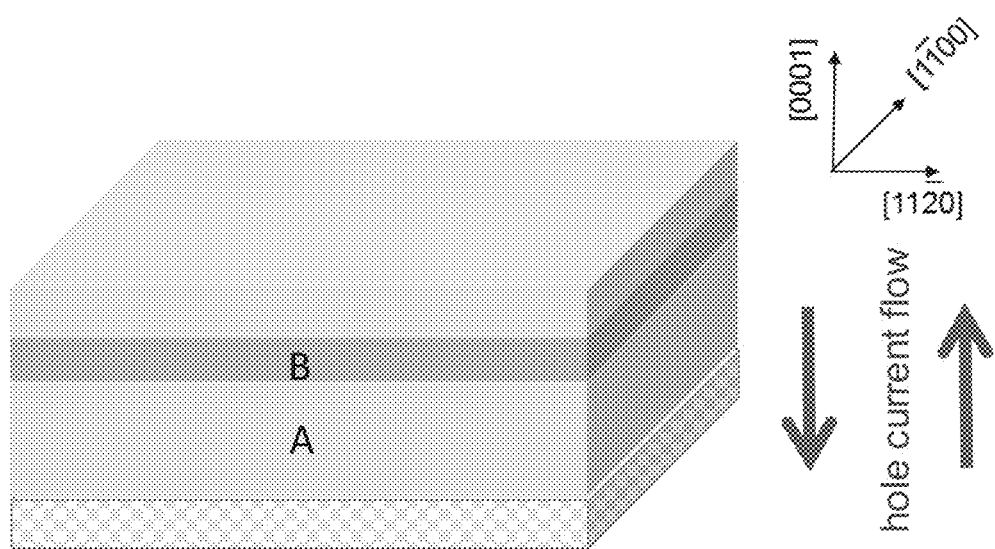
FIG. 32. Example structures with biaxial tensile strain in material B to allow light hole transport in the vertical direction, as the a-lattice constant of relaxed material A is larger than that of relaxed material B. A porous group III-nitride layer, e.g. porous GaN can be used to aid the fabrication of layer A larger a-lattice constant compared to layer B, where material A could be InGaN and material B could be GaN. a is lattice constant.

In addition to uniaxial strain, light holes transport can be achieved under biaxial tensile strain in the a-m-plane of the hexagonal lattice when the hole transport occurs perpendicular to the plane of the biaxial strain, along the c-axis. Biaxial tensile strain is created in heterostructures where a layer composed of material B is placed on material A, where the a-lattice constant of material B is larger than that of material A. Example structures are GaN placed on top of InGaN or AlGaN placed on top of GaN (FIG. 32).

Thereby a porous group-III nitride material, e.g. porous GaN, can aid in the fabrication of relaxed (B,Al,Ga,In)N material, for example InGaN.

In a further layout the channel region which may or may not be on a sidewall, the AlGaN or InGaN is re-grown on the a- or m-plane or semi-polar sidewall of a GaN feature resulting in enhanced hole mobility in the vertical direction.

Advantages and Improvements

Illustrated herein are high performance complementary solution to power management using GaN based materials. One key to the complementary solution is to make high performance p-MOSFETs in GaN. We will use the pathway shown by first principles band structure calculations of the anisotropy of the effective mass of holes in the GaN system as shown in FIG. 1. The valence band of unstrained GaN exhibits degeneracy of the light hole and heavy hole bands resulting in a large average hole effective mass and therefore a low hole mobility (predicted to be ~100 cm2V-1s-1 and measured to be less than 30 cm2V-1s-1 in MOSFETs). Besides the metal polar device structures, complementary N-polar structures will be evaluated as well.

REFERENCES FOR PART A

The following references are incorporated by reference herein.

[1] M. Suzuki and T. Uenoyama, J. Appl. Phys. 80, 6868 (1996).
[2] S. Keller, N. A. Fichtenbaum, C. Schaake, C. J. Neufeld, A. David, E. Matioli, Y. Wu, S. P. DenBaars, J. S. Speck, C. Weisbuch, and U. K. Mishra, Phys. Status Solidi Basic Res. 244, 1797 (2007).
[3] S. Keller, N. A. Fichtenbaum, C. Schaake, C. J. Neufeld, Y. Wu, K. McGroddy, A. David, S. P. DenBaars, J. S. Speck, C. Weisbuch, and U. K. Mishra, J. Appl. Phys. 100, 054314 (2006).
[4] S. Keller, C. Lund, T. Whyland, Y. Hu, C. Neufeld, S. Chan, S. Wienecke, F. Wu, S. Nakamura, J. S. Speck, S. P. DenBaars, and U. K. Mishra, Semicond. Sci. Technol. 30, 105020 (2015).
[5] X. Liu, R. Yeluri, J. Kim, S. Lal, A. Raman, C. Lund, S. Wienecke, J. Lu, M. Laurent, S. Keller, and U. K. Mishra, Appl. Phys. Lett. 103, 053509 (2013).
[6] S. H. Chan, M. Tahhan, X. Liu, D. Bisi, C. Gupta, O. Koksaldi, H. Li, T. Mates, S. P. DenBaars, S. Keller, and U. K. Mishra, Jpn. J. Appl. Phys. 55, 21501 (2016).
[7] T. Matsuno, H. Masato, A. Ryoji, K. Inoue, Inst. Phys. Conf. Ser. No. 129: chapter 9, p. 729, Paper presented at Int. symp. GaAs and Related Compounds, Karuizawa, Japan 1992.

[8] T. B. Fehlberg, G. A. Umana-Membreno, B. D. Nener G. Parish, C. S. Gallinat, G. Koblmüller, S. Rajan, S. Bemardis, J. S. Speck, Jpn. J. Appl. Phys. 45 (2006) L1090.

[9] S. Keller, C. Schaake, N. A. Fichtenbaum, C. J. Neufeld, Y. Wu, K. Mc Groddy, A. David, S. P. DenBaars, C. Weisbuch, J. S. Speck, U. K. Mishra, J. Appl. Phys. 100 (2006) 054314.

[10] S. Keller, C. Lund, T. Whyland, Y. Hu, C. Neufeld, S. Chan, S. Wienecke, F. Wu, S. Nakamura, J. S. Speck, S. P. DenBaars, U. K. Mishra, Semicond. Sci. Technol. 30 (2015) 105020.

[11] Z. YARAR, B. OZDEMIR, and M. OZDEMIR, Journal of ELECTRONIC MATERIALS, Vol. 36, No. 10, 2007

Part II: Impact of Strain on Enhancing the Performance of III-Nitride Photonic Devices Such as Lasers and Light Emitting Diodes III-N based structures are widely used for photonic and electronic devices. The state-of-the-art devices are based on either lattice-matched or biaxially strained wurtzite 111-N materials. Such materials use in plane electron and hole material properties that are substantially similar to bulk wurtzite materials. This patent teaches structures and methods on a class of materials wherein either the electron or the hole or both materials properties are modified through the implementation of strain to modify electronic and photonic device performance and enable a new class of circuit embodiments.

A critical parameter limiting the performance of today's nitride based optoelectronic devices, in particular lasers, is the low hole concentration and low hole mobility in p-type III-nitride layers, [caused by the high electronic hole mass and resulting low hole mobility. In this section, we describe structure(s) for and method(s) to make high performance optoelectronic devices in GaN. In one or more embodiments, we use the pathway revealed by first principles band structure calculations of the anisotropy of the effective mass of holes in the GaN system as discussed herein. The valence band of unstrained GaN exhibits degeneracy of the light hole and heavy hole bands resulting in a large average hole effective mass and therefore a low hole mobility. The situation remains largely unchanged on application of biaxial strain. However, as shown in FIGS. 1e and 1d, under the application of uniaxial compressive strain in the y direction, the energy of the light hole band energy rises and there is a marked anisotropy, with a very light hole effective mass available in the ky direction. To take advantage of the light hole mass the preferred orientation of for hole conduction is in the y-direction.

Example Photonic Device Structures

Figure 33:
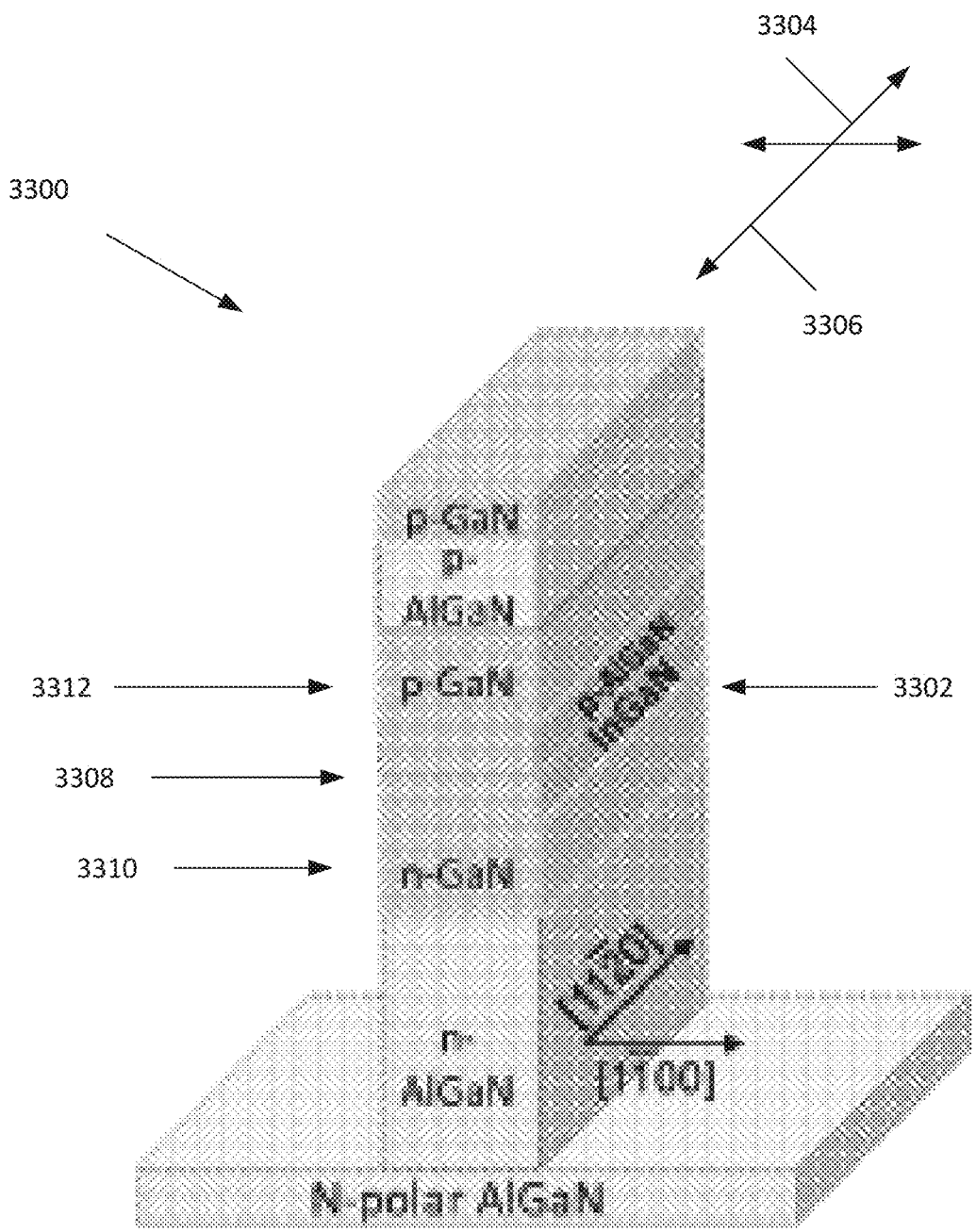
FIG. 33 illustrates an optoelectronic device.

FIG. 33 illustrates a structure wherein light holes can reduce the threshold current in lasers and increase the modulation speed of both group III nitride lasers and LEDs. In this first approach the dimensions of the laser stripe geometry are tuned in such a way that the geometry allows relaxation of the p-GaN layer perpendicular to the stripe direction while maintaining its strained nature in the parallel direction so that light holes will form in the p-GaN layers. While the schematic shows an edge emitting laser, the invention can also be applied to LEDs and VCELs.

In a second approach either strained regrown III-nitrides or stressor films or both are used to induce the strain in the desired region. This second approach is illustrated for an individual pixel in a pixelated LED structure in FIG. 34. The regrown InGaN sides create compressive strain in the GaN layers perpendicular to the stripe, resulting in light hole formation in the enclosed layers and additional improved hole transport occurring along the stripe direction. To prevent escape of carriers into the InGaN side regions, a thin barrier layer can be grown prior to the deposition of the InGaN side regions (not shown in the FIG. 34).

Figure 35:
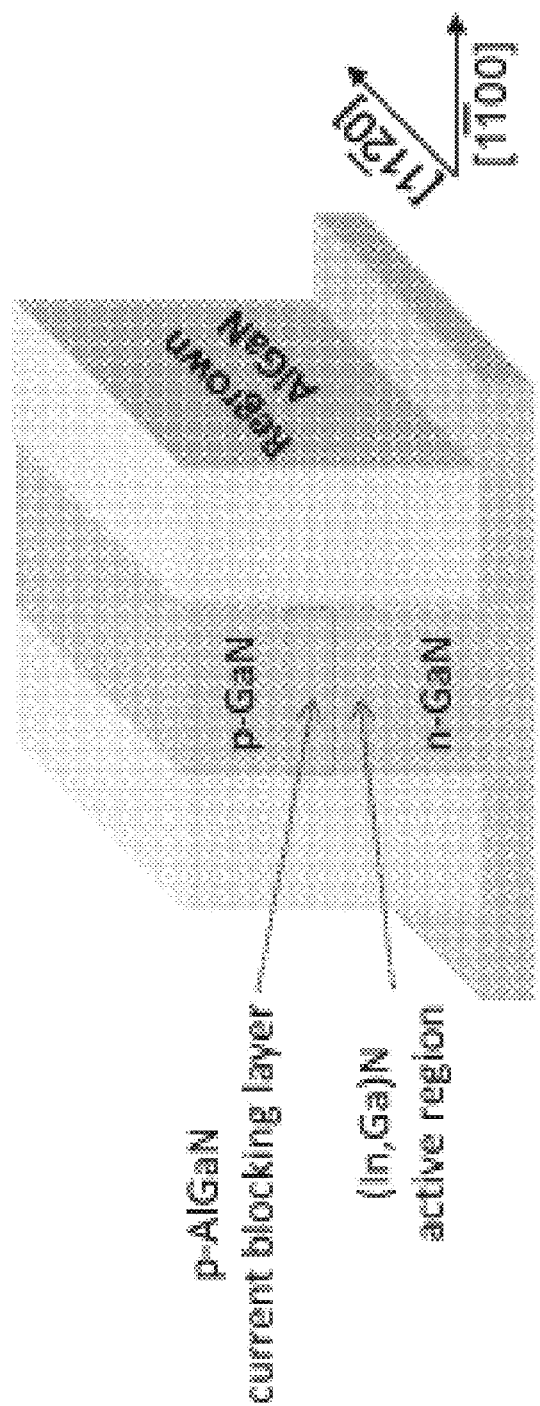
FIG. 35 illustrates an optoelectronic device according to another example.

In an alternate layout the stripe direction can be rotated by 90 degrees as illustrated in FIG. 35. Here uniaxial tension perpendicular to stripe is induced by regrown p-AlGaN, generating light holes in all enclosed layers.

Figure 36:
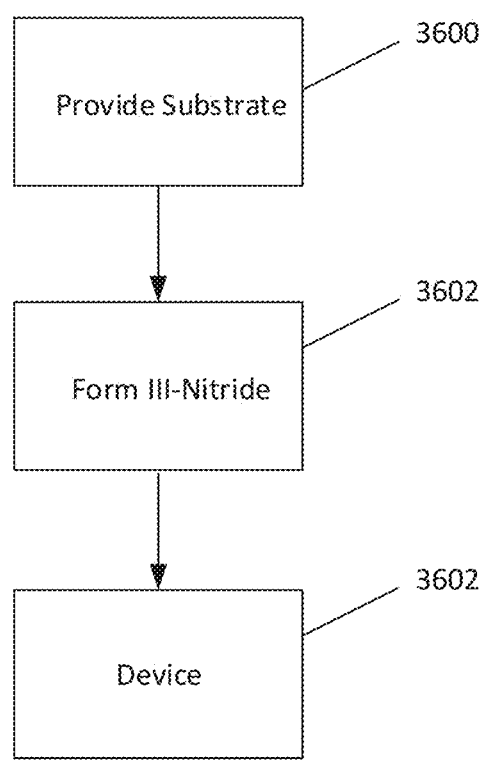
FIG. 36 is a flowchart illustrating a method of making a device.

This method can be used for all photonic group-III nitride photonic devices. While the uniaxial strain conditions described in the examples hold for epitaxial layer structure grown in the (0001) or c-direction as well as in the (000-1) or -c-direction, other strain conditions can be used in devices grown in non-c-plane directions Part III: Process Steps FIG. 36 is a flowchart illustrating a method of making a device.

Block 3600 represents providing a substrate.

Block 3602 represents depositing or forming a device on the substrate or layer, the device including III-nitride material strained along a first direction and at least partially relaxed along a direction perpendicular to the first direction. In one or more examples, the III-nitride is on or above a substrate or layer comprising porous III-nitride, and the forming comprises patterning the III-nitride into ridge or fin structures, wherein the porous III-nitride allows relaxation or partial relaxation of the fin structure perpendicular to the fin or the short axis while the fin material remains strained or relaxes less in the direction along the fin or the long direction resulting in uniaxial strain in the fin structure.

Block 3604 represents the end result, a device. Examples include, but are not limited to, the following.

1. A device 300 (referring to FIG. 3e and FIG. 3f), comprising:
    III-nitride material (layer B) strained along a first direction 302 and at least partially relaxed along a second direction 304 perpendicular to the first direction.
2. The device of example 1, wherein the III-nitride is on or above porous III-nitride (layer A) wherein the porous III-nitride and/or the III-nitride is patterned into ridge or fin structures 306, wherein the porous III-nitride allows relaxation or partial relaxation of the fin structure perpendicular to the fin or the short axis 304 while the fin material remains strained or relaxes less in the direction 302 along the fin or the long direction 302 resulting in uniaxial strain in the fin structure (see FIG. 3f).
3. The device of example 2, wherein the porous III-nitride includes etched pores.
4. The device of example 2 or example 3, wherein the porous III-nitride comprises gallium nitride.
5. The device of example 1, wherein the device is a field effect transistor (FET), e.g., as illustrated in FIG. 3(a) or FIG. 3(c) including:
    a stripe 310 comprising the III-nitride material 312, wherein:
        the III-nitride material 312 is strained along the first direction comprising a long axis of the stripe and at least partially relaxed along the second direction comprising a direction (short axis) perpendicular to the long axis;
        the III-nitride material includes a channel layer;
    a source contact (S) comprising first metal on the stripe making ohmic contact to the channel;
    a drain contact (D) comprising second metal on the stripe making ohmic contact to the channel;

a gate contact (G) on the stripe between the source contact and the drain contact, the gate contact controlling flow of current along a direction of the long axis or short axis through the channel and between the source contact and the drain contact.

6. The device of example 5, wherein:
the channel comprises gallium and/or indium and/or aluminum (and/or boron)
the III-nitride material comprises the channel layer on a layer including gallium and/or aluminum and/or indium and/or boron,
a thickness of the layer comprising gallium and/or aluminum, and/or indium is more than 50% of a thickness of the stripe,
an composition is selected so as to obtain a desired strain in the channel along the long axis.

7. The device of example 5, e.g., as illustrated in FIG. 5 or FIG. 6 wherein:
the III-nitride material further includes a source region (p+ in FIG. 5) and a drain region (p+ in FIG. 5),
the source region is in physical contact with the channel layer between the source contact and the channel layer,
the drain region is in physical contact with the channel layer between the drain contact and the channel layer, and
the source region and the drain region have a lattice constant different than a lattice constant of channel so as to induce the strain in the channel layer along the long axis.

8. The device of example 7, wherein the source region and the drain region comprise gallium and/or aluminum, and/or indium (e.g., InGaN channel case on GaN).

9. The device of any of the examples 5-8, wherein:
the current between the source contact and the drain contact is along the long axis that is a crystallographic a- or m-direction of the III-nitride,
the short axis direction perpendicular to the long axis is a crystallographic m- or a-direction of the III-nitride, respectively.
the top surface of the stripe has a polar (0001) or (000-1) orientation, and
the channel has a lattice constant larger than the underlying III-nitride material.

10. The device of any of the examples 5-8, wherein:
the current between the source contact and the drain contact is along the short axis that is a crystallographic a- or m-direction of the III-nitride,
the long axis direction perpendicular to the short axis is a crystallographic a- or m-direction of the III-nitride,
the top surface of the stripe has a polar (0001) or (000-1) orientation, and
the channel has a lattice constant smaller than the underlying III-nitride material.

11. The device of any of the examples 5-8, wherein:
the current between the source contact and the drain contact is along the short axis that is a crystallographic m-direction of the III-nitride,
the long axis direction perpendicular to the short axis is a crystallographic c-direction of the III-nitride, and
the top surface of the stripe has a nonpolar a- or m-plane orientation.

12. The device of any of the examples 5-9, wherein the FET comprises a p-type FET conducting the current comprising holes and the strain along the long axis is uniaxial compressive strain.

13. A device comprising a CMOS device (e.g., as illustrated in FIG. 5) of any of the examples 5-12 wherein the FET comprises a p-type FET, the CMOS device further including:
the stripe including a second n-type FET including a second source contact (S) to the III-nitride material, a second drain contact (D) to the III-nitride material, and a second gate contact on the stripe between the second source contact and the second drain contact;
the III-nitride material comprises a second n-type channel layer between the second source contact and the second drain contact; and
insulator between the n-type FET and the p-type FET.

14. The CMOS device of example 13, wherein the second channel layer is strained along the long axis between the second source contact and the second drain contact.

15. The devices of any of the examples 5-9 or 13-14, wherein the strain along the long axis is uniaxial compressive strain and the long axis is along a direction of lowest hole effective mass.

Figure 7:
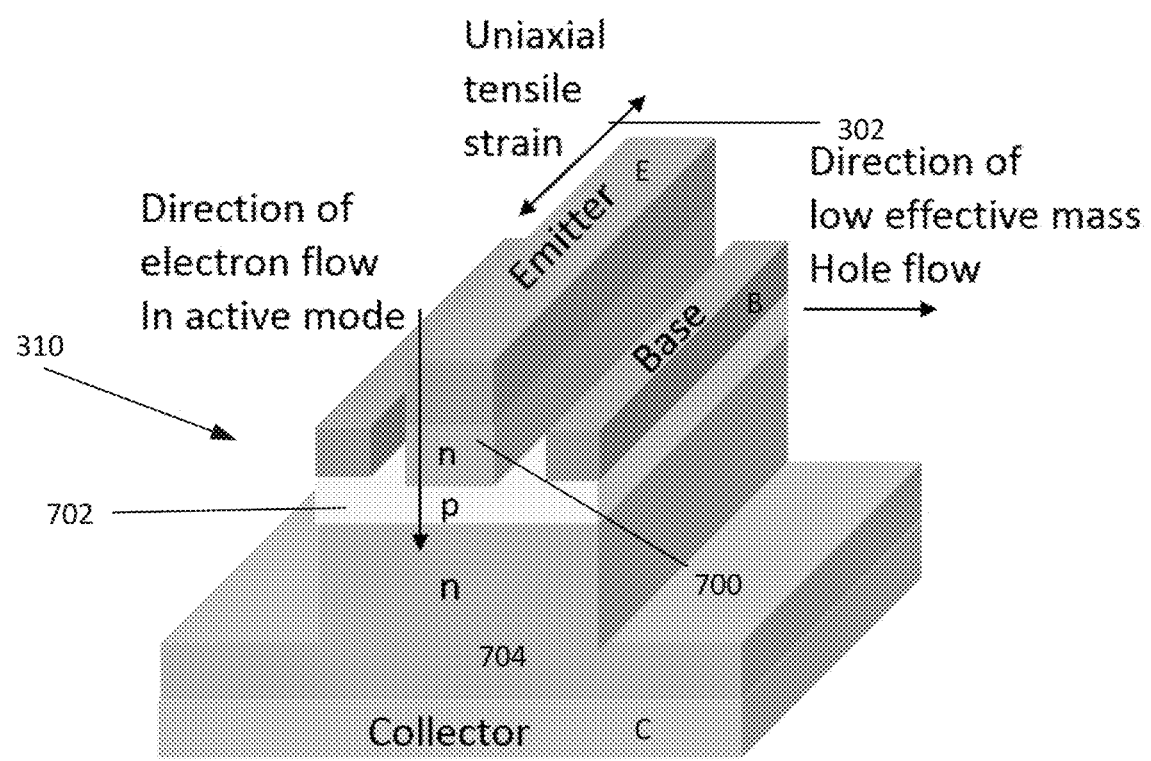
FIG. 7. Schematic of a BJT/HBT using uniaxial tensile strain to enhance base characteristics, showing the fin in the direction parallel to the direction of the uniaxial tensile strain. Base contacts are formed in the direction perpendicular to the fin FIG. 8. Schematic of BJT/HBT using uniaxial compressive strain to enhance base characteristics.

16. A device, comprising (e.g., as illustrated in FIG. 7):
a bipolar heterojunction transistor (BJT), including:
a stripe 310 comprising first n-type material 700 (*n*), wherein the n-type is strained along a long axis of the stripe;
an emitter contact (E) on a top surface of the stripe;
p-type material 702 between the first n-type material and second n-type material 704 (*n*), wherein the p-type material is on a bottom surface of the stripe opposite the emitter contact;
a base contact (B) to the p-type material;
a collector contact (C) to the second n-type material;
wherein a direction of electron flow in an active mode of the BJT is between the emitter and the collector.

17. The device of example 16, wherein the strain along the long axis is uniaxial tensile strain.

18. The device of any of the examples 16-17, further comprising the base contact on a side of the stripe parallel to the long axis, as illustrated in FIG. 7.

19. The device of any of the examples 16-18, further comprising a plurality of the BJTs attached to the stripe and further including an additional base contact on top of the stripe between the BJTs, as illustrated in FIG. 8A.

20. The device of any of the examples 16-19, wherein the n-type material and the p-type material comprise III-nitride material.

Figure 34:
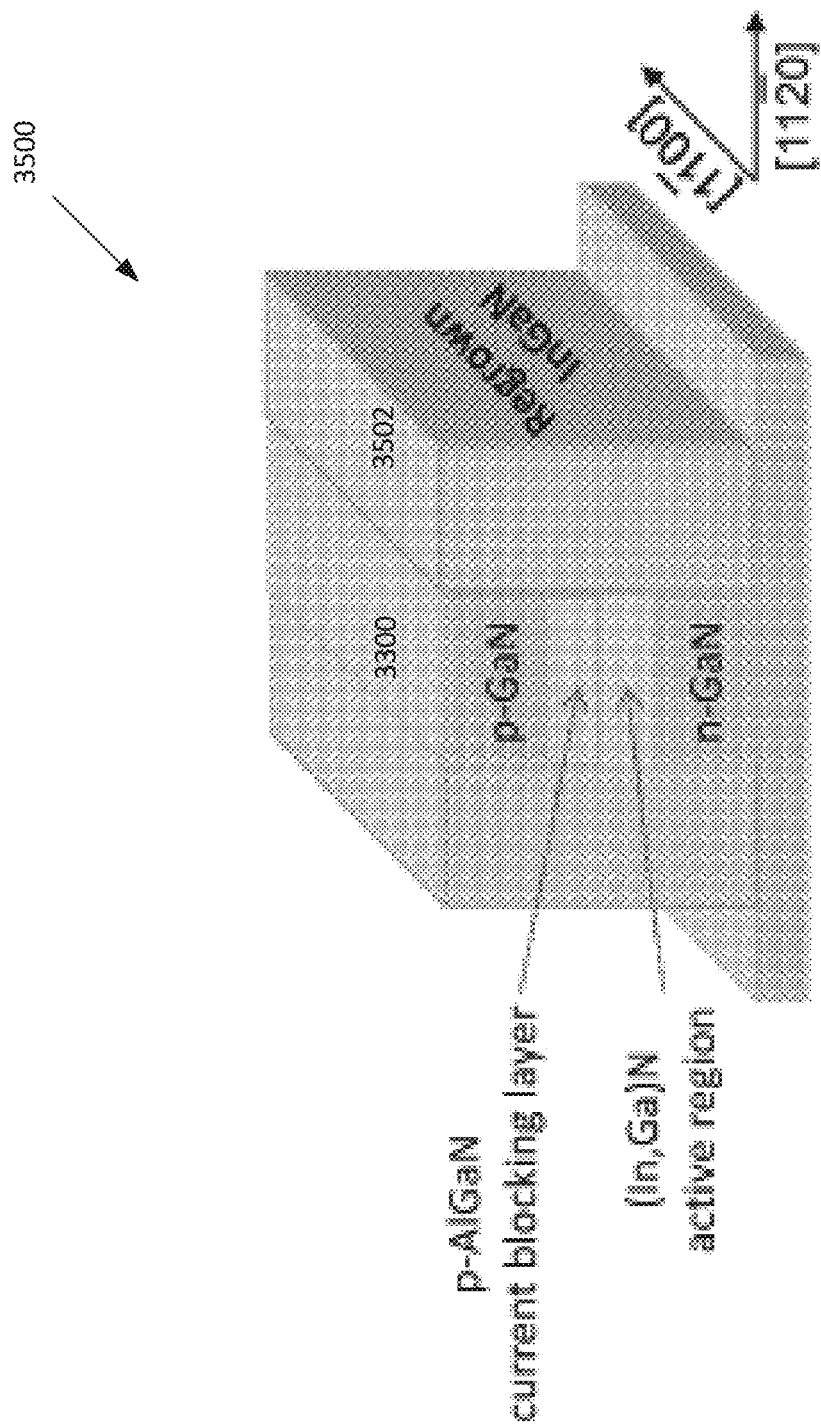
FIG. 34 illustrates an optoelectronic device including a pixel.

21. A field effect transistor (FET), comprising:
a stripe 310 including III-nitride material 312, wherein:
the III-nitride material includes an n-type channel layer strained along a long axis 302 of the stripe and at least partially relaxed along a direction 304 perpendicular to the long axis;
the III-nitride material includes an n-type channel layer (400, see FIG. 4 and FIG. 3) which is more strained/less relaxed along a long axis of the stripe and less strained/more relaxed along a direction perpendicular to the long axis; and
the n-type channel layer comprises gallium and/or aluminum, and/or indium;
a source contact (S) comprising first metal on the stripe making ohmic contact to the n-type channel;
a drain contact (D) comprising second metal on the stripe making ohmic contact to the n-type channel;
a gate contact (G) on the stripe between the source contact and the drain contact, the gate contact controlling flow of electron current along the direction perpendicular to the long axis through the n-type channel layer and between the source contact and the drain contact.
22. The FET of example 21, wherein the III-nitride material includes a layer comprising aluminum and gallium and indium between the n-type channel and the source contact, the drain contact, and the gate contact.
23. The FET of examples 21 or 22, wherein a top surface of the stripe on which the source contact and drain contact are formed is an N-polar surface, so that the n-type channel layer has an N-polar orientation.
24. The FET of example 23, wherein the current flows through a two dimensional electron gas (2DEG) or two dimensional hole gas induced from a back-barrier comprising the layer of gallium and/or aluminum, and/or indium, so contact to the 2DEG or hole gas is formed over an entire contact area and not merely at an edge of the ohmic regions contacting the n-type channel layer.
25. The device or FET of any of the preceding examples, wherein the stripe length is at least 2 times longer than the stripe width.
26. An optoelectronic device, comprising (e.g., as illustrated in FIG. 33):
a stripe 3300 comprising III-nitride material 3302, wherein:
the III-nitride material is strained along a long axis 3304 of the stripe and at least partially relaxed along a second direction 3306 perpendicular to the long axis or the short axis; and
the III-nitride material includes:
an active region 3308;
a III-nitride n-type layer 3310; and
a III-nitride p-type layer 3312, wherein the active region is between the n-type layer and the p-type layer. The active region may emit light in response to holes injected from the p-type region and electrons injected from the n-type region recombining in the active region.
27. The device of example 26, wherein the active region includes InGaN, the p-type region includes n-type GaN, and the p-type layer comprises p-type GaN.
28. The device of example 26 or 27, further comprising (e.g., as illustrated in FIG. 34):
a pixel 3500 including the stripe;
material 3502 grown on either side of the stripe so as to create compressive strain in the layers in the stripe, resulting in light hole formation in the enclosed layers and additional improved hole transport occurring along the stripe direction.
29. The device of example 28, wherein the material grown on either side of the stripe comprises InGaN or III-nitride.
30. The device of examples 26-29, wherein the device has an N-polar orientation.
31. The device of examples 26-30, wherein the device comprises a light emitting diode, a laser diode, a solar cell, or a photodiode.
32. A device, comprising:
III-nitride material 312 is strained along a long axis 302 (or short axis) of the stripe 310 and at least partially relaxed along a direction 304 perpendicular to the long axis (or the short axis);
the III-nitride material includes a channel layer;
a source contact comprising first metal on the stripe making ohmic contact to the channel;
a drain contact comprising second metal on the stripe making ohmic contact to the channel;
a gate contact on the stripe between the source contact and the drain contact, the gate contact controlling flow of current along a direction of the long axis or short axis through the channel and between the source contact and the drain contact.
33. The device of examples 1-2, wherein the device is a transistor, a light emitting diode, a laser diode, a solar cell or a photodiode, and the III-nitride material includes the device's active region.
34. The device of example 33, wherein the active region includes InGaN.
35. The device of examples 33 or 34, wherein the device is biased and contacted so as to take advantage of lower effective hole mass along the first direction.
36. The device of example 35, wherein the device comprises a field effect transistor including a channel, wherein the source and drain are along the first direction so that current flows along the first direction between the source and the drain.
37. The device of example 36, wherein the III-nitride material is relaxed over a distance of at least one micron in the second direction.
38. A device, comprising: III-nitride material which is at least partially biaxially relaxed (e.g., along the first direction 302 and the second direction 304).
39. The device of example 1 or 38, wherein the III-nitride is on a porous III-nitride, and patterned into features 306, wherein the porous III-nitride allows relaxation or partial biaxial relaxation of the structure.
40. The device of example 2 or 39, wherein the porous III-nitride includes etched pores.
41. The device of example 2, 3 or 39 or 40, wherein the porous III-nitride comprises gallium nitride.
42. The FET of any of the preceding examples, wherein the stripe has a width in a range of 100-20 000 nanometers and the source contact and drain contact have a width less than the device width.
43. The stripe and channel materials can be composed of any (B,Al,Ga,In)(N) and any (B,Al,Ga,In)(N,As,P) alloy, as long as the geometry and the lattice constant conditions are met.
44. For high power, plus useful gain at 220 GHz and 340 GHz, the HEMTs must exhibit fmax of 500 GHz and 800 GHz respectively. For high fmax, we must first increase ft. Increasing the electron velocity in the channel brings a double benefit, decreasing the transit time and, through increased transconductance, reducing the C parasitic/gm charging time. Increasing the electron velocity in the channel by using relaxed InGaN as the channel material which provides a reduced electron effective mass, critical in reducing electron scattering and enhancing electron velocity.
45. In one example, the device comprises a high-power nitrogen-polar AlGaN/InGaN mm-Wave Power HEMTs. Adding InGaN channels to this technology, the upper cutoff frequencies can be extended to as high as 800 GHz, and provide output power exceeding 1 W/mm at 220 and 340 GHz. The InGaN channel must be relaxed; growth directly on GaN would introduce strain. Similar to strain-induced changes in mobility in InGaAs, strain in InGaAs would increase the electron effective mass and thus decrease the electron mobility and channel injection velocity. An $In_{0.2}Ga_{0.8}N$ channel should have a high >5000 cm2/V-s 2DEG mobility, enabling high, plus a 2.5 eV bandgap, enabling high-voltage, high-power operation. Indeed, 3570 cm2/Vs mobility has been measured for InN, nearly 6:1 larger that than that observed in GaN at similar carrier densities. As described herein, relaxed InGaN layers can be formed in an unique manner, e.g., growing material in 200 nm width fin. In the direction of the cross-section of the fin, the N-polar GaN/InGaN/AlGaN stack relaxes after patterning to that of InGaN. The electron effective mass in the transport direction, determined by the relaxed lattice constant, will then be low. Using X-ray analysis, we have demonstrated that of nano-stripe patterning relaxes the strain in InGaN/GaN multi quantum wells; in this example, the technique is applied to N-polar GaN/InGaN/AlGaN HEMTs.

46. With an InGaN channel the electron velocity will be ~$1.3 \cdot 10^7$ cm/s, increasing fmax to 500 GHz. In one or more further examples, improved targets may be reached with a shorter gate length and a slightly higher relaxed indium composition. Other example enhancements extending fmax to its targets include reduced gate length for reduced intrinsic delay and thinned channels to maintain aspect ratio and voltage gain. Together, these methods may, in some examples, double fτ to ~240 GHz. Source, drain, and gate parasitic resistances will be reduced by improved contact resistivity, increased channel conductivity, shorter access regions, and reduced gate finger length. Together, these can deliver fmax beyond 800 GHz.

47. In one or more examples, to adequately relax the strain, the fins must be narrow. To fit, in one or more examples the Ohmic contacts must be at most 100 nm long, which then demands extremely low specific contact resistivity. N-polar GaN HEMTs have shown 2.3 Ohm-$\mu m^2$ ρ, a record low for GaN. In one or more examples, to further reduce the contact resistivity, the N+ contact regrowths may be graded from $In_{0.2}Ga_{0.8}N$ to $In_{0.63}Ga_{0.37}N$ or even to InN, and may be doped at ~$10^{20}$ $cm^{-3}$, the high doping assisted in part by strong 3D polarization doping from the rapid compositional gradient.

48. A transistor operating at terahertz modulation frequencies comprising a transistor of any of the preceding embodiments.

49. A power amplifier or cellular network including the transistor of any of the preceding embodiments.

50. A device comprising III-nitride material having a low hole effective mass in the vertical direction via biaxial strain (here the split off band is the one with the low effective mass). See e.g., FIG. 32.

51. (a) A device where the GaN is biaxially strained such that it results in the split-off band as the topmost valence band (above the light hole and the heavy hole in the valence band) resulting in increased hole mobility in the vertical direction.

52. (b) A device wherein the channel region which may or may not be on a sidewall, the AlGaN or InGaN is re-grown on the a- or m-plane or semi-polar sidewall of a GaN feature resulting in enhanced hole mobility in the vertical direction.

53. (c) A device that combines the above examples 51 and 52, with example 51a) referring to the drift region of the device and example 52 b) referring to the channel region of the device.

Nomenclature

GaN and its ternary and quaternary compounds incorporating aluminum and indium (AlGaN, InGaN, AlInGaN) are commonly referred to using the terms (Al,Ga,In)N, III-nitride, III-N, Group III-nitride, nitride, Group III-N, $Al_{(1-x-y)}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

REFERENCES FOR PART A

The following references are incorporated by reference herein.

[1] J. Piprek, IEEE International conference on Numerical Simulation of Optoelectronic Devices, Sydney, Australia, 2016, DOI: 10. 1 109/NUSOD.2016.7:546997

[2] M. Suzuki and T. Uenoyama, J. Appl. Phys. 80, 6868 (1996).

[3] S. Keller, N. A. Fichtenbaum, C. Schaake, C. J. Neufeld, A. David, E. Matioli, Y. Wu, S. P. DenBaars, J. S. Speck, C. Weisbuch, and U. K. Mishra, Phys. Status Solidi Basic Res. 244, 1797 (2007).

[4] S. Keller, N. A. Fichtenbaum, C. Schaake, C. J. Neufeld, Y. Wu, K. McGroddy, A. David, S. P. DenBaars, J. S. Speck, C. Weisbuch, and U. K. Mishra, J. Appl. Phys. 100, 054314 (2006).

[5] S. Keller, C. Lund, T. Whyland, Y. Hu, C. Neufeld, S. Chan, S. Wienecke, F. Wu, S. Nakamura, J. S. Speck, S. P. DenBaars, and U. K. Mishra, Semicond. Sci. Technol. 30, 105020 (2015).

Part IV: Example Applications and Systems Using Embodiments Described Herein.

Modern computing systems based on Von Neumann architecture relies on a clear distinction between logic and memory and processes information by executing a sequence of precise atomic instructions with periodic uploads to the memory. As we enter the age of machine learning, big data analytics and secure cloud computing, the heavy data traffic between the processing units and memory becomes a fundamental bottleneck of high performance computing.

The mega trends of cloud computing, big data and IoT are driving an insatiable need for unlimited bandwidth and enhanced security for wireless communication systems, requiring disruptive innovations in frequency-agile and adaptive-bandwidth analog technologies. Extensive research expertise in in-situ control and tuning of extra-ordinary electrical, mechanical and magnetic response in synthetic heterostructures can be used to create reconfigurable and adaptive analog circuits that are capable of operating at multiple frequencies and bandwidths.

Extremely large-scale heterogeneous integration of memory, logic and analog devices in future electronic systems warrant radical packaging solutions to address the growing challenges in power delivery, signal integrity, thermal management and electromagnetic/RF interferences. Innovations in materials can be leveraged for logic, memory and analog devices and seek new packaging paradigm to provide superior power-performance-reliability-cost in smaller volume, with higher security through smart shielding, with efficient power management by fine-grain integration of passives, and enhanced communication bandwidth by package level implementation of waveguides.

RF and mixed-signal technologies for frequency-agile systems targeting smaller volume, higher energy-efficiency, fine-grain reconfiguration, hardware security and CMOS compatibility through heterogeneous integration of functional materials such as MIT and ferroelectric phase transition materials, complementary ultra-wide band gap (UWBG) power transistors and magneto-electric multi-ferroics into analog devices (FIG. 4). The six tasks in this theme are described below:

High efficiency DC-DC converters: 48 to IV point-of-load (PoL), system-in-package, DC-DC converters for data center applications, targeting >100 MHz operation, ~200 W output power, >90% peak (>70% light-load) efficiency. Breakthroughs in complementary GaN FETs and control and circuit design techniques (3.1) will lead to significant energy and cost savings in power routing. Polarization-induced p-channel FETs in AlN/GaN heterostructures can be used as a step towards complementary GaN logic.

Part V: Example THz Systems Including Embodiments Described Herein 0.1-1 THz converged wireless systems may enable revolutionary capabilities in communications and perception with far-reaching implications for industry and national security. The tiny wavelengths enable vast numbers of elements to be packed into physically small antenna arrays, which in turn allows the vast available bandwidth to be reused many times by using narrow, tightly focused beams. These physical characteristics to build highly agile systems with immense communications capacity, and an unparalleled combination of resolution and robustness.

Embodiments (e.g., transistors) described herein can be used cellular infrastructure using hubs with massive spatial multiplexing, providing 1-100 Gb/s to the end user, and, with 100-1000 simultaneous independently-modulated beams, aggregate hubs capacities in the 10's of T b/s. Cellular infrastructure may include a mix of optical links and Tb/s-capacity point-point massive MIMO links. These mobile links will support cm-precision localization, supplementing GPS, and will use imaging techniques to locate communications partners. This intelligent immersive infrastructure may support low-latency virtual reality (VR), augmented reality (AR), and seamless telepresence.

Embodiments described herein (e.g., transistors) can be used in transportation, supporting autonomous vehicles and intelligent highways. Wideband inter-car links may communicate data and measure vehicle locations to cm-precision; anticipating and manage interactions, and avoid collisions. Unparalleled high-resolution imaging, compact enough to fit on a car, may let drivers see through extreme fog and rain as well as our eyes can on a clear day, while low-cost, light-weight "whisper radios" will replace wire harnesses in vehicles.

Embodiments described herein may be used in the air, providing a framework for rich situational awareness, navigation and mapping using networks of drones. Revolutionary new capabilities in individual sensors include THz 4K-video resolution imaging radar or synthetic aperture radar (SAR) may be small enough to fit on a drone or UAV, allowing these to fly in smoke/dust to detect, identify, and engage threats, even in darkness or when blinded by weather or sunlight.

Embodiments described herein may be used in RF/wireless/THz, analog and digital IC, and, for increased range and reduced DC power.

In one or more examples, we refer to 0.1-1 THz as "THz". 30-300 GHz is mm-wave and 0.3-3 THz sub-mm-wave.

Many aspects have direct applicability to 5G and future standards, including >100 GHz, with orders of magnitude higher data rates and spectral efficiency. The move to the mm-wave and THz bands is an attractive option for obtaining truly transformative gains in wireless systems.

Embodiments described herein can be used for mm-wave/THz ICs and arrays for communication and imaging. Exemplary modules contain arrays of antennas and the RF (THz) signal channels. The modules may operate with RF carriers in the 100's of GHz, with arrays of 100-1000 elements, and with 1-100 GHz symbol modulation rates, where each module will transmit or receive 100-1000 independent beams simultaneously. The baseband signal processing, with a careful balance of analog and digital stages, may spatially demultiplex (separate) hundreds of high-rate signals, and will do so while consuming only moderate DC power. Multipath propagation will cause inter symbol interference in these high-rate streams, which will be corrected by analog and digital equalizers or nulled by adaptive beamformers.

Application-specific THz transistors may be key to extending performance. Advanced GaN and InP transistors may increase the output power and improve the efficiency while reducing the receiver noise and increasing the upper frequency range of these THz systems. These component-level improvements may result in reduced system power, increased system range and bit rate for carrier frequencies where silicon solutions remain feasible, but will also enable higher-frequency systems for increased capacity and—in the context of imaging—resolution.

Embodiments described herein can be the foundation of a new generation of Tb/s capacity mobile and residential wireless communications, compact yet high-resolution imaging systems for cars and UAVs, and systems merging communications, sensing and imaging.

These terabit-capacity wireless networks and high-resolution imaging systems exploit the 900 GHz of bandwidth between 0.1-1 THz—spectrum that has been made newly accessible by rapid increases in transistor cutoff frequencies in the last decade. Yet, increasing the carrier frequency not only brings more channel capacity into play, but also changes the character of propagation, bringing radically new opportunities along with significant technical difficulties.

The difficulties include high attenuation and easily-blocked beams. Of course, the high frequencies also bring considerable opportunities. In one or more examples, an antenna array designed for broad angular steering may have ~$\lambda/2$ element spacing. Because the wavelengths are small (0.3-3 mm), even a large array will occupy little space: a 1000-element, 140 GHz array occupies less than 2 square inches. Such arrays have high gain, recovering signal strength, though the radiation pattern is now narrow, hence beams must be steered to find and track moving communication partners. With the right electronics and control algorithms, such arrays can form, aim, and track multiple beams, with each beam using the same spectrum while carrying independent modulation, and with a massive number of beams. An antenna array can resolve the directions of incoming signals; it is thus, of course, also an imaging system. With an array of diameter D, the angular resolution is ~ $k/D$, so very sharp, TV-like imaging is feasible, even from a very small imager. Yet, in a simple imaging array, the number of image pixels is the number of receiver channels; an HDTV-like 1920×1080 pixel imager would need a staggering $2 \cdot 10^6$ RF channels.

Large, 100- to 10,000-element THz phased-array transmitters and receivers, constructed in silicon VLSI, may be very small, fitting easily on platforms from large to tiny: planes, cars, unmanned aerial vehicles (UAVs), drones, and even handsets. The large arrays compensate for the high THz propagation losses, allowing ~250-500m range. High-capacity radio transceivers, carrying 100-1000 channels, and high-resolution imaging systems, can both be made very small. The functions of imaging and communication can be merged, using imaging techniques to determine directions of incoming signals when establishing communication links, and using, as with GPS, signal time-of-flight in communications networks so that radios on mobile platforms can determine precisely where they are.

THz wireless systems need application-specific THz transistors. High-speed transistors, based on advanced semiconductor materials described herein, may enable systems operating above 250 GHz. Even at lower frequencies, from 100-250 GHz, MOSFET noise figures are relatively high, and MOSFET transistor output power and efficiency are low. Custom high-power and low-noise transistors may greatly improve the transmission range and reduce the DC power consumption in systems below 200 GHz. As antenna element spacings are typically $\lambda/2$, there is little IC area available to fit the power amplifier, so high power density is also important.

Hardware, such as the mm-wave/THz ICs and Arrays for Communication and Imaging include sophisticated THz RF-IC architectures supporting the targeted systems. In one or more examples, these silicon ICs must operate at signal frequencies up to 220 GHz, with ICs in the custom semiconductor technologies up/down-converting to 340, 650, or 1080 GHz as appropriate. The transmitter and receiver ICs may be arrays, e.g., containing ~100-1000 elements, the symbol rates may be be 1-100 GHz, and, whether on transmit or receive, and the ICs may process up to 100 or even 1000 simultaneous beams. In one or more examples, the front-end RF-IC design thus requires high carrier frequencies, wide bandwidths, high dynamic range, and very many channels.

Transceiver RF sections and its baseband may use Terabit baseband signal processing ICs. In one or more examples, the baseband sections of the massive MIMO receivers must process and separate 100-1000 channels of 1-100 Gbs/s data. If the MIMO beam separation is 100% digital, then the ADCs must have high sample rates and high resolution (note that despite the large number of antennas—which would reduce the ADC resolution requirements—there is also a large number of beams), and the subsequent digital processing may have many bits of resolution, high clock rates, and many parallel channels.

Example Application-Specific THz Transistors

Embodiments described herein may be used to exploit 100 GHz-1 THz carrier frequencies for high-capacity communications and for high-resolution imaging.

Given the high propagation losses noted above, even with arrays of considerable size, THz links can be constrained to very short transmission range. Though we will increase range greatly by increasing the number of array elements and array RF channels, at some point array size becomes limited by the cost of these increasingly complex ICs and by the power consumed in managing so many RF channels. Thus, application-specific THz transistors using embodiments described herein may comprise high-power GaN- and InP-based power transistors for increased transmitter power and improved efficiency, and InP-based low-noise transistors for improved receiver sensitivity, both increasing range and both reducing DC power consumption. Further, for increased capacity and improved resolution, communications links and imaging systems having carrier frequencies above 250 GHz may be used. Although in fundamental mode operation transistors can provide gain close to their cutoff frequencies, or, in harmonic mode operation, even several times this, in both cases receiver sensitivity and transmitter power and efficiency are very low. For amplifiers with low noise, high output power, or high efficiency, the transistor cutoff frequencies must be 3:1 to 4:1 times the signal frequency. Embodiments described herein may be used in infrastructure and consumer hardware (e.g., GaN and InP transistors with bandwidth sufficient for efficient low-noise, high-power, efficient operation at 340, 650, and 1080 GHz).

Examples include advanced III-V (e.g., Gallium Nitride and Indium Phosphide) high-frequency transistors. THz systems may use transistors, at strategic points in the signal chain, to extend communications range and reduce power consumption. As with today's cell phones, future THz systems may use CMOS VLSI for the baseband and the RF signal chain, but, where performance demands it, also in high-performance transistors in the RF front-ends, specifically in the power amplifiers and low-noise amplifiers.

CMOS VLSI offers high integration scales and low die cost. Though the raw device-level cutoff frequencies are c.a. 300-400 GHz in leading technologies, once wiring stack losses are considered, useful amplifier gain can be obtained up to ~220 GHz. High-frequency performance is best in 45-32-22 nm technologies; in nodes beyond this, the transistors start to approach the physical limits of scaling, and the RF bandwidth degrades. Further, above 100 GHz, even though there is sufficient available gain, these transistors have high noise figures, provide only limited RF output power, and generate signal power at only low DC-RF efficiency. Radios using these transistors in the power- and low-noise amplifiers will have very limited transmission range; at least, unless the transceivers use very large phased arrays for high aperture gains.

Example systems at 140, 220, 340, 650, and 1080 GHz may be used. At 140 and 220 GHz, we will explore the trade-offs in system complexity, cost, and power consumption between smaller arrays using high-efficiency III-V power- and low-noise amplifiers and larger arrays using CMOS PAs and LNAs. At 340 GHz and higher, III-V transistors, with their wider bandwidths, must also translate 220 GHz signals, generated by CMOS, to the higher transmission frequency.

Higher-power amplifiers directly increase system range. Efficient power amplifiers reduce power consumption. This is particularly important, as power amplifier efficiency might otherwise be only 5-10%. Lower-noise amplifiers also directly increase system range. Importantly, a less noisy low-noise amplifier saves much DC power; if we improve the receiver noise figure by 3 dB, then the transmitter need radiate only one-half the RF power.

Advanced mm-Wave/THz devices, extending the capabilities of 0.1-1 THz systems may be implemented using embodiments described herein, including advanced field-effect-transistors with very low noise figure, and transistors with high output power and high efficiency. The benefit is increased system range and greatly reduced DC power. The GaN transistors, offer very high output powers; the applications for these include arrays, but extend beyond them to high-power single-source systems such as synthetic aperture radar and jammers. The InP transistors offer—3:1 smaller power densities at a given frequency, but offer—3:1 greater useful frequency range. The cutoff frequencies of these GaN and InP transistors will be high, enabling operation, with low noise, high power, and high efficiency, at 340, 650, and 1080 GHz.

Advanced, high-performance mm-wave/THz devices can be developed, including N-polar GaN HEMTs, adding InGaN channels in a strain-relaxed pedestal structure to push bandwidth to 800 GHz, and supporting high-power amplifiers to 220 and perhaps 340 GHz.

In one or more examples, reducing the effective mass of InGaN on GaN through strain relaxation and thereby increasing frequency performance of InGaN on GaN, opens a pathway to enhancing electron transport properties in InGaN channels through strain relaxation enabling THz performance at high efficiency.

GaN HEMTs are now considered the preferred power device for RF power for commercial to military applications. The trade-off between dispersion, gate breakdown, and field-plate capacitance limiting gain in Ga-polar HEMTs to date has been broken using N-polar GaN based HEMTs. Deep recessed N-polar HEMTs have produced power density three times larger than Ga-polar HEMTS at 94 GHz; with power added efficiency (PAE) greater than 25% at 8 W/mm. This is because of the ability to simultaneously maximize charge in the channel, eliminate/reduce field plates dimensions, enabling high gain while maintaining breakdown because of the reverse polarization of the AlGaN under that gate (compared to Ga-polar structures). The clear remaining hard problem that has emerged is the limited velocity of electrons in the GaN channel and the ability to maintain high gain at bias conditions amenable to high efficiency operation. In one approach, N-polar HEMTs are made using relaxed InGaN channels using both MBE and MOCVD. The variation of electron effective mass with In composition may also be determined. Relaxed InGaN channels may achieve lower effective mass by using fin geometries for the transistors. We have shown relaxation using fin geometries in InGaN/GaN superlattices. The degree of relaxation with fin dimension may be established via X-ray reciprocal space maps (RSMs). Processes to fabricate fin HEMTs to exploit the effective mass in the relaxed dimension may be optimized.

TABLE 5

Summary of challenges and approaches

| Critical Challenges | Solutions | Demonstration Vehicles |
|---|---|---|
| Efficient high power density PAs | N-polar InGaN HEMTS AlN/GaN/AlN HEMTS | MIMO grand challenge testbaed at 140, 220, 340 GHz |
| Cost efffective GaN | AlN/GaN/AlN HEMTs on Silicon | MIMO grand challenge testbed at 140 GHz |
| Removing heat in high power PAs | Diamond thermal management for GaN | MIMO grand challenge testbed at 140 GHz |
| Ultra efficient 140 Ghz, 1080 Ghz Pas 340-1080 Ghz Transmitter front ends | THz InP HBTs | MIMO grand challenge testbed at 140-1080 GHz 340 GHz frequency scanned imaging demonstration |
| Low Noise for energy efficient 140 GHz 220 GHz links 340-1080 Ghz Transmitter front ends | THz InAs/InP MOS HEMTS | MIMO grand challenge testbed at 140-1080 GHz 340 GHz frequency scanned imaging demonstration |
| Low cost LNAs and PAs | THz InP MOS HEMTS and HBTS on Silicon | MIMO grand challenge testbed at 140-220, 340 GHz |
| High Power Sources for THZ imaging | Monolithically integrated GaN THz signal sources by harmonic generation | Focal plane imaging grand challenge test bed (source) |

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

TABLE I

Electron and hole effective masses ($m_0$) and crystal-field and spin-orbit splitting energies (mryd) of bulk wurtzite GaN and AlN. $m_e$, $m_{hh}$, $m_{lh}$, and $m_{ch}$ denote electron, heavy-hole, light-hole, and crystal-field split-off hole effective masses, respectively.

|  | $m_e^{\parallel}$ | $m_e^{\perp}$ | $m_{hh}^{\parallel}$ | $m_{lh}^{\parallel}$ | $m_{ch}^{\parallel}$ | $m_{hh}^{\perp}$ | $m_{lh}^{\perp}$ | $m_{ch}$ | $\Delta_{cr}$ | $\Delta_{so}$ |
|---|---|---|---|---|---|---|---|---|---|---|
| GaN | 0.20 | 0.18 | 1.76 | 1.76 | 0.16 | 1.61 | 0.14 | 1.04 | 5.3 | 1.2 |
| AlN | 0.33 | 0.25 | 3.53 | 3.53 | 0.25 | 10.42 | 0.24 | 3.81 | −4.3 | 1.5 |

The superscripts $\parallel$ and $\perp$, stand for the $k_z$ direction and the $k_x$ direction, respectively. $D_{cr}$ and $D_{so}$ represent crystal-field and spin-orbit splitting energies, respectively. From ref. [5]

A. Example Methods to Generate Uniaxial Strain

1. First Example Method

The present disclosure demonstrates uniaxially strained quantum wells by using strain relaxation in fin geometries as seen for an InGaN/GaN Multi Quantum Well (MQW) fin in FIG. 2 [2, 3, 4]. While the MQW fin partially relaxes in the direction perpendicular to the stripe, it is fully strained parallel to the stripe direction. The etched stripe arrays were of high crystalline quality and exhibited intense photoluminescence as illustrated in FIG. 2d.

When the fin structures are composed in part of a porous group-III nitride material, such as porous GaN, for example, or are placed on top of a porous group-III nitride material, relaxation or partial relaxation can be achieved over larger dimensions easing the fabrication process of the fin based devices.

This is the preferred approach to create strained GaN channels for the proposed p-MOSFETs with the ability to hold substantial voltage (greater than 2V) between source/gate and drain. To generate the necessary compressive strain in the GaN channel along the stripe direction, the bulk of the stripes may be composed of $Al_xGa_{1-x}N$, and the amount of strain can be tailored by the specific Al mole fraction x.

The epitaxial layer structures can be grown by MOCVD or MBE or any other technique suitable to deposit III-N materials. The preferred embodiment shown here is based on the metal-polar orientation of the III-N system. The device shown is one in which a substantial voltage (>2V) is held in the source drain direction when the

What is claimed is:

1. A device, comprising:
   a ridge or fin structure comprising III-nitride material that is at least partially biaxially relaxed or strained along a first direction of the ridge or the fin structure and at least partially relaxed along a second direction perpendicular to the first direction, wherein the III-nitride material in the ridge or the fin structure comprises a III-nitride layer on a porous III-nitride layer.

2. The device of claim 1, wherein the porous III-nitride layer allows relaxation or partial relaxation of the III-nitride layer perpendicular to the first direction (along a short axis of the ridge or the fin structure) while the III-nitride layer remains strained or relaxes less in the first direction along a long axis of the ridge or the fin structure, resulting in uniaxial strain in the ridge or the fin structure.

3. The device of claim 2, wherein the porous III-nitride includes etched pores.

4. The device of claim 2, wherein the porous III-nitride comprises gallium nitride.

5. The device of claim 1, wherein the III-nitride material is at least partially biaxially relaxed.

6. The device of claim 5, wherein the porous III-nitride layer allows relaxation or partial biaxial relaxation of the III-nitride layer.

7. The device of claim 1, wherein the III-nitride layer is biaxially strained such that the biaxial strain results in the III-nitride layer having a split-off band as its topmost valence band resulting in increased hole mobility in a vertical direction.

8. The device of claim 7, wherein the III-nitride layer further comprises a channel region, wherein the channel region comprises AlGaN or InGaN re-grown on an a- or m-plane or semi-polar sidewall of a GaN feature, resulting in enhanced hole mobility in the vertical direction, wherein the III-Nitride material comprises gallium nitride comprising a drift region.

9. A device comprising a field effect transistor (FET), comprising:
   a stripe comprising III-nitride material, wherein:
      the III-nitride material includes a channel layer on a layer;
   a source contact comprising a first metal on the stripe making ohmic contact to the channel layer;
   a drain contact comprising second metal on the stripe making ohmic contact to the channel layer;
   a gate contact on the stripe between the source contact and the drain contact, the gate contact controlling flow of current along a direction of a long axis or a short axis of the stripe through the channel layer and between the source contact and the drain contact,
   the source contact and the drain contact are positioned for the flow of current along the long axis when the layer has a smaller lattice constant than the channel layer so that the channel layer is strained along a first direction comprising a long axis of the stripe and at least partially relaxed along a second direction comprising a direction (short axis) perpendicular to the long axis; and
   the source contact and the drain contact are positioned for the flow of the current along the short axis when the channel layer has a smaller lattice constant than the layer.

10. The device of claim 9, wherein:
    the channel layer comprises GaN and the layer comprises AlGaN or the channel layer comprises InGaN and the layer comprises GaN, and
    a thickness of the layer is more than 50% of a thickness of the stripe.

11. The device of claim 9, wherein:
    the current between the source contact and the drain contact is along the long axis,
    the long axis is along a crystallographic a- or m-direction of the III-nitride material,
    the top surface of the stripe has a polar (0001) or (000-1) orientation, and
    the channel layer has a lattice constant larger than the layer.

12. The device of claim 9, wherein:
    the current between the source contact and the drain contact is along the short axis,
    the short axis is along a crystallographic a- or m-direction of the III-nitride material,
    a top surface of the stripe has a polar (0001) or (000-1) orientation, and
    the channel layer has a lattice constant smaller than the layer.

13. The device of claim 9, wherein:
    the current between the source contact and the drain contact is along the short axis, the short axis is along a crystallographic m-direction of the III-nitride material, the long axis perpendicular to the short axis is along a crystallographic c-direction of the III-nitride material, and the top surface of the stripe has a nonpolar a- or m-plane orientation.

14. The device of claim 9, wherein the FET comprises a p-type FET conducting the current comprising holes and use strain along the long axis is uniaxial compressive strain.

15. A CMOS device comprising the FET of claim 9 wherein the FET comprises a p-type FET and the CMOS device further comprises:

the stripe including a second n-type FET including a second source contact to the III-nitride material, a second drain contact to the III-nitride material, and a second gate contact on the stripe between the second source contact and the second drain contact;

the III-nitride material comprises a second n-type channel layer between the second source contact and the second drain contact; and insulator between the n-type FET and the p-type FET.

16. The CMOS device of claim 15, wherein the second channel layer is strained along the long axis between the second source contact and the second drain contact.

17. The devices of claim 9, wherein the strain along the long axis is uniaxial compressive strain and the long axis is along a direction of lowest hole effective mass.

18. The device of claim 9, wherein:

the channel layer comprises an n-type channel layer.

19. A device comprising a field effect transistor, comprising:

a stripe comprising III-nitride material, wherein the III-nitride material includes a channel layer;

a source region, and a drain region, the source region is in physical contact with the channel layer between the source contact and the channel layer, the drain region is in physical contact with the channel layer between the drain contact and the channel layer, and the source region and the drain region have a lattice constant different than a lattice constant of channel layer so as to induce strain in the channel layer along a long axis of the stripe.

20. The device of claim 19, wherein the source region and the drain region comprise gallium and/or aluminum and/or indium.

* * * * *